United States Patent
Ma et al.

(10) Patent No.: US 9,761,514 B2
(45) Date of Patent: Sep. 12, 2017

(54) SUBSTRATE FOR INTEGRATED CIRCUIT DEVICES INCLUDING MULTI-LAYER GLASS CORE AND METHODS OF MAKING THE SAME

(71) Applicant: Intel Corporation, Santa Clara, CA (US)

(72) Inventors: Qing Ma, Saratoga, CA (US); Chuan Hu, Chandler, AZ (US); Patrick Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/205,223

(22) Filed: Jul. 8, 2016

(65) Prior Publication Data

US 2016/0322290 A1 Nov. 3, 2016

Related U.S. Application Data

(63) Continuation of application No. 12/653,722, filed on Dec. 17, 2009, now Pat. No. 9,420,707.

(51) Int. Cl.
*H05K 1/11* (2006.01)
*H01L 23/498* (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC ... H05K 1/05; H05K 1/11; H05K 3/00; H05K 3/42; H01L 21/02; H01L 21/44;
(Continued)

(56) References Cited

U.S. PATENT DOCUMENTS 3,958,317 A  5/1976 Peart et al.
4,221,047 A  9/1980 Narken et al.
(Continued)

FOREIGN PATENT DOCUMENTS

CN  101542719 A  9/2009
EP  1164823 A3  9/2003
(Continued)

OTHER PUBLICATIONS

Office Action received for German Patent Application No. 112010004888.6, mailed on Jan. 25, 2017, 6 Pages of German Office Action Only.
(Continued)

*Primary Examiner* — Xiaoliang Chen
(74) *Attorney, Agent, or Firm* — Winkle, PLLC

(57) ABSTRACT

Disclosed are embodiments of a substrate for an integrated circuit (IC) device. The substrate includes a core comprised of two or more discrete glass layers that have been bonded together. A separate bonding layer may be disposed between adjacent glass layers to couple these layers together. The substrate may also include build-up structures on opposing sides of the multi-layer glass core, or perhaps on one side of the core. Electrically conductive terminals may be formed on both sides of the substrate, and an IC die may be coupled with the terminals on one side of the substrate. The terminals on the opposing side may be coupled with a next-level component, such as a circuit board. One or more conductors extend through the multi-layer glass core, and one or more of the conductors may be electrically coupled with the build-up structures disposed over the core. Other embodiments are described and claimed.

17 Claims, 21 Drawing Sheets

(51) Int. Cl.
  *H05K 3/42* (2006.01)
  *H05K 3/46* (2006.01)
  *H01L 21/48* (2006.01)
  *H01L 23/367* (2006.01)
  *H01L 23/00* (2006.01)

(52) U.S. Cl.
  CPC .... *H01L 23/3675* (2013.01); *H01L 23/49827* (2013.01); *H01L 23/49838* (2013.01); *H01L 23/49894* (2013.01); *H01L 24/17* (2013.01); *H01L 24/32* (2013.01); *H01L 24/73* (2013.01); *H05K 3/42* (2013.01); *H05K 3/4605* (2013.01); *B32B 2457/08* (2013.01); *H01L 2224/16227* (2013.01); *H01L 2224/32245* (2013.01); *H01L 2224/73253* (2013.01); *H01L 2224/81815* (2013.01); *H01L 2924/0002* (2013.01); *H01L 2924/0102* (2013.01); *H01L 2924/0105* (2013.01); *H01L 2924/01005* (2013.01); *H01L 2924/01011* (2013.01); *H01L 2924/01012* (2013.01); *H01L 2924/01013* (2013.01); *H01L 2924/01016* (2013.01); *H01L 2924/01019* (2013.01); *H01L 2924/01024* (2013.01); *H01L 2924/01025* (2013.01); *H01L 2924/01027* (2013.01); *H01L 2924/01029* (2013.01); *H01L 2924/01047* (2013.01); *H01L 2924/01051* (2013.01); *H01L 2924/01074* (2013.01); *H01L 2924/01079* (2013.01); *H01L 2924/01082* (2013.01); *H01L 2924/05442* (2013.01); *H01L 2924/14* (2013.01); *H01L 2924/15184* (2013.01); *H01L 2924/15788* (2013.01); *H05K 2201/0195* (2013.01); *H05K 2201/096* (2013.01); *Y10T 156/10* (2015.01)

(58) Field of Classification Search
  CPC ..... H01L 21/48; H01L 21/486; H01L 21/768; H01L 23/48; H01L 23/52; H01L 23/49822
  USPC ........ 174/264, 255, 256, 258, 262; 257/532, 257/690, 700, 734, 752; 361/47, 748, 361/794; 438/39, 108, 653, 712
  See application file for complete search history.

(56) References Cited

U.S. PATENT DOCUMENTS

| | | | |
|---|---|---|---|
| 4,327,143 A | 4/1982 | Alvino et al. | |
| 4,379,553 A | 4/1983 | Kelly | |
| 4,404,060 A * | 9/1983 | Trausch | G03F 7/0007 205/135 |
| 4,622,058 A | 11/1986 | Leary-Renick et al. | |
| 4,639,543 A | 1/1987 | Fang | |
| 4,664,309 A | 5/1987 | Allen et al. | |
| 4,672,152 A | 6/1987 | Shinohara et al. | |
| 4,828,597 A | 5/1989 | Glascock, II et al. | |
| 4,975,103 A | 12/1990 | Ackermann et al. | |
| 5,023,098 A | 6/1991 | Sumi et al. | |
| 5,193,668 A | 3/1993 | Fukuchi et al. | |
| 5,294,238 A | 3/1994 | Fukada et al. | |
| 5,446,488 A | 8/1995 | Vogel | |
| 5,466,488 A | 11/1995 | Toyoda et al. | |
| 5,585,675 A | 12/1996 | Knopf | |
| 5,611,876 A | 3/1997 | Newton et al. | |
| 5,612,171 A | 3/1997 | Bhagavatula | |
| 5,668,405 A | 9/1997 | Yamashita | |
| 5,705,855 A | 1/1998 | Carson et al. | |
| 5,917,652 A | 6/1999 | Mathers et al. | |
| 5,981,880 A | 11/1999 | Appelt et al. | |
| 6,023,098 A | 2/2000 | Higashiguchi et al. | |
| 6,037,656 A | 3/2000 | Sugahara | |
| 6,156,413 A | 12/2000 | Tomari et al. | |
| 6,177,707 B1 | 1/2001 | Dekker et al. | |
| 6,194,762 B1 | 2/2001 | Yamazaki et al. | |
| 6,309,901 B1 | 10/2001 | Tahon et al. | |
| 6,320,547 B1 | 11/2001 | Fathy et al. | |
| 6,329,610 B1 | 12/2001 | Takubo et al. | |
| 6,339,197 B1 | 1/2002 | Fushie et al. | |
| 6,413,620 B1 | 7/2002 | Kimura et al. | |
| 6,468,447 B2 | 10/2002 | Matsumoto | |
| 6,534,723 B1 | 3/2003 | Asai et al. | |
| 6,539,750 B1 | 4/2003 | Takagi et al. | |
| 6,590,165 B1 | 7/2003 | Takada et al. | |
| 6,673,698 B1 | 1/2004 | Lin et al. | |
| 6,691,409 B2 | 2/2004 | Suzuki et al. | |
| 6,772,514 B2 | 8/2004 | Ogura et al. | |
| 6,781,064 B1 | 8/2004 | Appelt et al. | |
| 6,799,438 B2 | 10/2004 | Herzbach et al. | |
| 6,839,946 B2 | 1/2005 | Ylilammi et al. | |
| 6,894,358 B2 | 5/2005 | Leib et al. | |
| 6,989,604 B1 | 1/2006 | Woo et al. | |
| 7,038,309 B2 | 5/2006 | Hsu et al. | |
| 7,071,521 B2 | 7/2006 | Leib et al. | |
| 7,072,018 B2 | 7/2006 | Yamamura et al. | |
| 7,091,589 B2 | 8/2006 | Mori et al. | |
| 7,164,572 B1 | 1/2007 | Burdon et al. | |
| 7,176,131 B2 | 2/2007 | Meyer-Berg et al. | |
| 7,259,080 B2 | 8/2007 | Quenzer et al. | |
| 7,279,771 B2 | 10/2007 | Sunohara et al. | |
| 7,285,834 B2 | 10/2007 | Leib et al. | |
| 7,307,852 B2 | 12/2007 | Inagaki et al. | |
| 7,337,540 B2 | 3/2008 | Kurosawa | |
| 7,362,403 B2 | 4/2008 | Uehara | |
| 7,379,553 B2 | 5/2008 | Nakajima et al. | |
| 7,476,623 B2 | 1/2009 | Schreder et al. | |
| 7,749,900 B2 | 7/2010 | Li et al. | |
| 7,993,510 B2 | 8/2011 | En | |
| 2001/0042854 A1 | 11/2001 | Matsumoto | |
| 2002/0027282 A1 | 3/2002 | Kawakami et al. | |
| 2002/0038725 A1 | 4/2002 | Suzuki et al. | |
| 2002/0046880 A1 | 4/2002 | Takubo et al. | |
| 2002/0145197 A1 | 10/2002 | Ohta et al. | |
| 2002/0159243 A1 | 10/2002 | Ogawa et al. | |
| 2002/0180015 A1 | 12/2002 | Yamaguchi et al. | |
| 2002/0182958 A1 | 12/2002 | Tani et al. | |
| 2003/0062111 A1 | 4/2003 | Moriya | |
| 2003/0063453 A1 | 4/2003 | Kusagaya et al. | |
| 2003/0066683 A1 | 4/2003 | Suzuki et al. | |
| 2004/0071960 A1 | 4/2004 | Weber et al. | |
| 2004/0137701 A1 | 7/2004 | Takao | |
| 2004/0151882 A1 | 8/2004 | Tani et al. | |
| 2004/0168825 A1 | 9/2004 | Sakamoto et al. | |
| 2004/0178492 A1 | 9/2004 | Tsukamoto et al. | |
| 2004/0217455 A1 | 11/2004 | Shiono et al. | |
| 2004/0239349 A1 | 12/2004 | Yamagishi et al. | |
| 2005/0012217 A1 | 1/2005 | Mori et al. | |
| 2005/0016764 A1 | 1/2005 | Echigo et al. | |
| 2005/0098882 A1 | 5/2005 | Kusagaya et al. | |
| 2005/0189136 A1 | 9/2005 | Kawasaki et al. | |
| 2005/0218503 A1 | 10/2005 | Abe et al. | |
| 2006/0005382 A1 | 1/2006 | Hsien | |
| 2006/0043572 A1 | 3/2006 | Sugimoto et al. | |
| 2006/0191708 A1 | 8/2006 | Kawasaki et al. | |
| 2006/0191710 A1 | 8/2006 | Fushie et al. | |
| 2006/0201201 A1 | 9/2006 | Fushie et al. | |
| 2006/0201818 A1 | 9/2006 | Fushie et al. | |
| 2006/0216897 A1 | 9/2006 | Lee et al. | |
| 2006/0244128 A1 | 11/2006 | Hayashi et al. | |
| 2006/0251364 A1 | 11/2006 | Terahara et al. | |
| 2006/0255816 A1 | 11/2006 | Shioga et al. | |
| 2006/0255817 A1 | 11/2006 | Yamagishi | |
| 2006/0261364 A1 | 11/2006 | Suehiro et al. | |
| 2006/0289968 A1 | 12/2006 | Sulfridge | |
| 2007/0060970 A1 | 3/2007 | Burdon et al. | |
| 2007/0090416 A1 | 4/2007 | Doyle et al. | |
| 2007/0096328 A1 | 5/2007 | Takahashi et al. | |
| 2007/0119619 A1 | 5/2007 | Nakamura et al. | |
| 2007/0154741 A1 | 7/2007 | Takahashi et al. | |
| 2007/0175025 A1 | 8/2007 | Tsukamoto et al. | |
| 2007/0186414 A1 | 8/2007 | Abe et al. | |
| 2007/0227765 A1 | 10/2007 | Sakamoto et al. | |

(56) References Cited

U.S. PATENT DOCUMENTS

| | | | |
|---|---|---|---|
| 2007/0230151 A1 | 10/2007 | Hayashi et al. | |
| 2007/0257356 A1 | 11/2007 | Abe et al. | |
| 2007/0267138 A1 | 11/2007 | White et al. | |
| 2008/0073110 A1 | 3/2008 | Shioga et al. | |
| 2008/0107863 A1 | 5/2008 | Ikeda et al. | |
| 2008/0149384 A1 | 6/2008 | Kawabe | |
| 2008/0152928 A1 | 6/2008 | Miyauchi et al. | |
| 2008/0164057 A1 | 7/2008 | Mori et al. | |
| 2008/0217748 A1 | 9/2008 | Knickerbocker | |
| 2008/0218983 A1* | 9/2008 | Nakamura | C23C 26/00 361/748 |
| 2008/0261005 A1 | 10/2008 | Nomiya et al. | |
| 2008/0277148 A1 | 11/2008 | Asai et al. | |
| 2008/0283277 A1 | 11/2008 | Muramatsu et al. | |
| 2008/0283282 A1 | 11/2008 | Kawasaki et al. | |
| 2009/0001550 A1 | 1/2009 | Li et al. | |
| 2009/0159316 A1 | 6/2009 | Kuramochi | |
| 2009/0174065 A1 | 7/2009 | Hayashi et al. | |
| 2009/0183910 A1 | 7/2009 | Sunohara | |
| 2009/0243065 A1 | 10/2009 | Sugino et al. | |
| 2009/0273073 A1 | 11/2009 | Tachibana et al. | |
| 2009/0293271 A1 | 12/2009 | Tanaka | |
| 2009/0294161 A1 | 12/2009 | Yoshimura et al. | |
| 2010/0006328 A1 | 1/2010 | Kawasaki et al. | |
| 2010/0019382 A1 | 1/2010 | Miwa et al. | |
| 2010/0032826 A1 | 2/2010 | Tachibana et al. | |
| 2010/0164030 A1 | 7/2010 | Oggioni et al. | |
| 2011/0101399 A1 | 5/2011 | Suehiro et al. | |
| 2011/0233786 A1 | 9/2011 | Homma et al. | |
| 2012/0106117 A1 | 5/2012 | Sundaram et al. | |
| 2012/0305303 A1 | 12/2012 | Hossain et al. | |

FOREIGN PATENT DOCUMENTS

| | | | |
|---|---|---|---|
| EP | 1298972 | A3 | 8/2005 |
| JP | 61-116881 | A | 6/1986 |
| JP | 05-267853 | A | 10/1993 |
| JP | 06-237081 | A | 8/1994 |
| JP | H06275954 | A | 9/1994 |
| JP | 2000-119047 | A | 4/2000 |
| JP | 2000-299310 | A | 10/2000 |
| JP | 2001-053191 | A | 2/2001 |
| JP | 2003-142804 | A | 5/2003 |
| JP | 2005-005488 | A | 1/2005 |
| JP | 2006-275954 | A | 10/2006 |
| JP | 2009-176791 | A | 8/2009 |
| JP | 2009-206502 | A | 9/2009 |
| JP | 2009-302506 | A | 12/2009 |
| KR | 1020040058765 | A | 7/2004 |
| KR | 10-0701205 | B1 | 3/2007 |

OTHER PUBLICATIONS

Schott "Mems Tightly Sealed With Schott HermeS", Schott Electronic Packaging, Jul. 30, 2009, 2 pages.

"Schott HermeS", NEC Schott Components Corporation Japan, Copyright 2009, 1 page.

NEC/Schott—Schott HermeS, "Schott Hermes Substrate", available online at <http://www.nec-schott.co.jp/enplish/auto/others/hermes.html?PHPSESSID=r4nmcg11d95hgugh5r253hq3d3>, retrieved on Dec. 9, 2009, 2 pages.

Notice of Allowance received for Taiwan Patent Application No. 099136723, mailed on Sep. 18, 2014, 2 pages of Taiwan Notice of Allowance.

Office Action received for Taiwan Patent Application No. 099136723, mailed on May 26, 2014, 28 pages (16 pages of English Translation and 12 pages of Taiwan Office Action).

Notice of Allowance received for Taiwanese Patent Application No. 099137777, mailed on Sep. 10, 2014, 2 pages of Official copy only.

Office Action received for Taiwan Patent Application No. 099137777, mailed on Dec. 19, 2013, 9 pages (4 pages of English Translation and 5 pages of Office Action).

Office Action received for German Patent Application No. 112010004888.6, mailed on Jul. 16, 2013, 5 pages of Office Action only.

Notice of Allowance received for German Patent Application No. 112010004890.8, mailed on Aug. 10, 2016, 14 pages of German Notice of Allowance.

Office Action received for German Patent Application No. 112010004890.8, mailed on Apr. 27, 2016, 7 pages of Office Action only.

Office Action received for German Patent Application No. 112010004890.8, mailed on Jul. 23, 2013, 7 pages of German Office Action.

Office Action received for United Kingdom Patent Application No. 1208343.2, mailed on Dec. 19, 2013, 4 pages.

Office Action received for United Kingdom Patent Application No. 1208343.2, mailed on Aug. 22, 2013, 3 pages.

Notice of Allowance received for Chinese Patent Application No. 201080057189.8, mailed on Mar. 7, 2016, 4 pages (2 pages of English Translation and 2 pages of Notice of Allowance).

Office Action received for Chinese Patent Application No. 201080057189.8, mailed on Dec. 26, 2014, 23 pages (14 pages of English Translation and 9 pages of Office Action).

Office Action received for Chinese Patent Application No. 201080057189.8, mailed on Jun. 18, 2015, 7 pages of Chinese Office Action only.

Office Action received for Chinese Patent Application No. 201080057189.8, mailed on May 4, 2014, 16 pages of Office Action including 9 pages of English Translation.

Office Action received for Chinese Patent Application No. 201080057189.8, mailed on Nov. 11, 2015, 3 pages of Chinese Office Action only.

Notice of Allowance received for Chinese Patent Application No. 201080058105.2, mailed on Sep. 8, 2015, 6 pages of Chinese Notice of Allowance including 4 pages of English Translation.

Office Action received for Chinese Patent application No. 201080058105.2, mailed on Dec. 12, 2014, 21 pages (2 pages of English Translation and 19 pages of Chinese Office Action).

Office Action received for Chinese Patent Application No. 201080058105.2, mailed on Jun. 3, 2014, 17 pages of Chinese Office Action including 4 pages of English Translation.

Office Action received for Chinese Patent Application No. 201080058105.2, mailed on May 11, 2015, 9 pages of Chinese Office Action.

Decision of Refusal received for Japanese Patent Application No. 2012-542016, mailed on May 20, 2014, 8 pages of Office Action including 4 pages of English Translation.

Office Action received for Japanese Patent Application No. 2012-542016, mailed on Jun. 25, 2013, 7 pages of Office Action including 4 pages of English Translation.

Notice of Allowance received for Korean Patent Application No. 10-2012-7015462, mailed on Aug. 24, 2014, 3 pages (1 page of English Translation and 2 pages of Notice of Allowance).

Office Action received for Korean Patent Application No. 2012-7015462, mailed on Feb. 26, 2014, 2 pages of Office Action only.

Office Action received for Korean Patent Application No. 2012-7015462, mailed on Aug. 19, 2013, 6 pages (3 pages of English Translation and 3 pages of Office Action).

Notice of Allowance received for Korean Patent Application No. 2012-7015587, mailed on Apr. 9, 2014, 3 pages of Korean Notice of Allowance.

Office Action received for Korean Patent Application No. 10-2012-7015587, mailed on Jun. 25, 2013, 4 pages of English Translation.

Office Action received for Korean Patent Application No. 10-2012-7015587, mailed on Feb. 3, 2014, 3 pages of English Translation.

Notice of Allowance received for Korean Patent Application No. 2014-7005894, mailed on Mar. 19, 2015, 3 pages of Korean Notice of Allowance including 1 page of English Translation.

Office Action received for Korean Patent Application 2014-7005894, mailed on Jun. 3, 2014, 4 pages of English Translation of Korean Office Action.

Office Action received for Korean Patent Application No. 2014-7005894, mailed on Oct. 21, 2014, 6 pages of Korean Office Action including 3 pages of English Translation.

(56) References Cited

OTHER PUBLICATIONS

Onezawa et al., "NEC Schott introduces Glass Substrates with Hermetic Metal Through Vias for WLP of MEMS & Sensor Applications", Aug. 7, 2009, 3 pages.
International Preliminary Report on Patentability received for PCT Patent Application No. PCT/US2010/054931, mailed on Jun. 28, 2012, 7 pages.
International Search Report and Written Opinion received for PCT Patent Application No. PCT/US2010/054931, mailed on Jun. 30, 2011, 9 pages.
International Preliminary Report on Patentability received for PCT Patent Application No. PCT/US2010/056310, mailed on Jun. 28, 2012, 7 pages.
International Search Report and Written Opinion received for PCT Patent Application No. PCT/US2010/056310, mailed on Jun. 30, 2011, 9 pages.
International Preliminary Report on Patentability and Written Opinion received for PCT Application No. PCT/US2012/028126, mailed on Sep. 18, 2014, 8 pages.
International Search Report and Written Opinion received for PCT Application No. PCT/US2012/28126, mailed on Nov. 30, 2012, 11 pages.

\* cited by examiner

US 9,761,514 B2

SUBSTRATE FOR INTEGRATED CIRCUIT DEVICES INCLUDING MULTI-LAYER GLASS CORE AND METHODS OF MAKING THE SAME

RELATED APPLICATIONS

The present application is a Continuation of U.S. patent application Ser. No. 12/653,722, filed on Dec. 17, 2009, entitled "Substrate for Integrated Circuit Devices Including Multi-Layer Glass Core and Methods of Making the Same", which is hereby incorporated herein by reference in its entirety and for all purposes. This application is also related to U.S. patent application Ser. No. 12/653,710, filed on Dec. 17, 2009, entitled "Glass Core Substrate for Integrated Circuit Devices and Methods of Making the Same", now U.S. Pat. No. 8,207,453, issued Jun. 26, 2012.

FIELD OF THE INVENTION

The disclosed embodiments relate generally to substrates for integrated circuit devices, and more particularly to a substrate having a multi-layer glass core.

BACKGROUND OF THE INVENTION

An integrated circuit (IC) die may be disposed in a package to support the die, as well as to aid in forming electrical connections between the die and a next-level component, such as a motherboard, mainboard, or other circuit board. The package typically includes a substrate to which the die is both mechanically and electrically coupled. For example, the IC die may be coupled to the substrate by an array of interconnects in a flip-chip arrangement, with a layer of underfill disposed around the interconnects and between the die and substrate. Each of the interconnects may comprise a terminal on the die (e.g., a bond pad, a copper pillar or stud bump, etc.) that is electrically coupled (e.g., by reflowed solder) to a mating terminal (e.g., a pad, pillar, stud bump, etc.) on the substrate. Alternatively, by way of further example, the IC die may be attached to the substrate by a layer of die attach adhesive, and a plurality of wire bonds may be formed between the die and substrate.

The IC die is disposed on one side of the substrate, and a number of electrically conductive terminals are formed on an opposing side of the substrate. The terminals on the opposing side of the substrate will be used to form electrical connections with the next-level component (e.g., a circuit board), and these electrical connections can be used to deliver power to the die and to transmit input/output (I/O) signals to and from the die. The electrically conductive terminals on the substrate's opposing side may comprise an array pins, pads, lands, columns, bumps etc., and these terminals may be electrically coupled to a corresponding array of terminals on the circuit board or other next-level component. The terminals on the package substrate's opposing side may be coupled to the next-level board using, for example, a socket (and retention mechanism) or by a solder reflow process.

DETAILED DESCRIPTION OF THE INVENTION

Figure 1A:
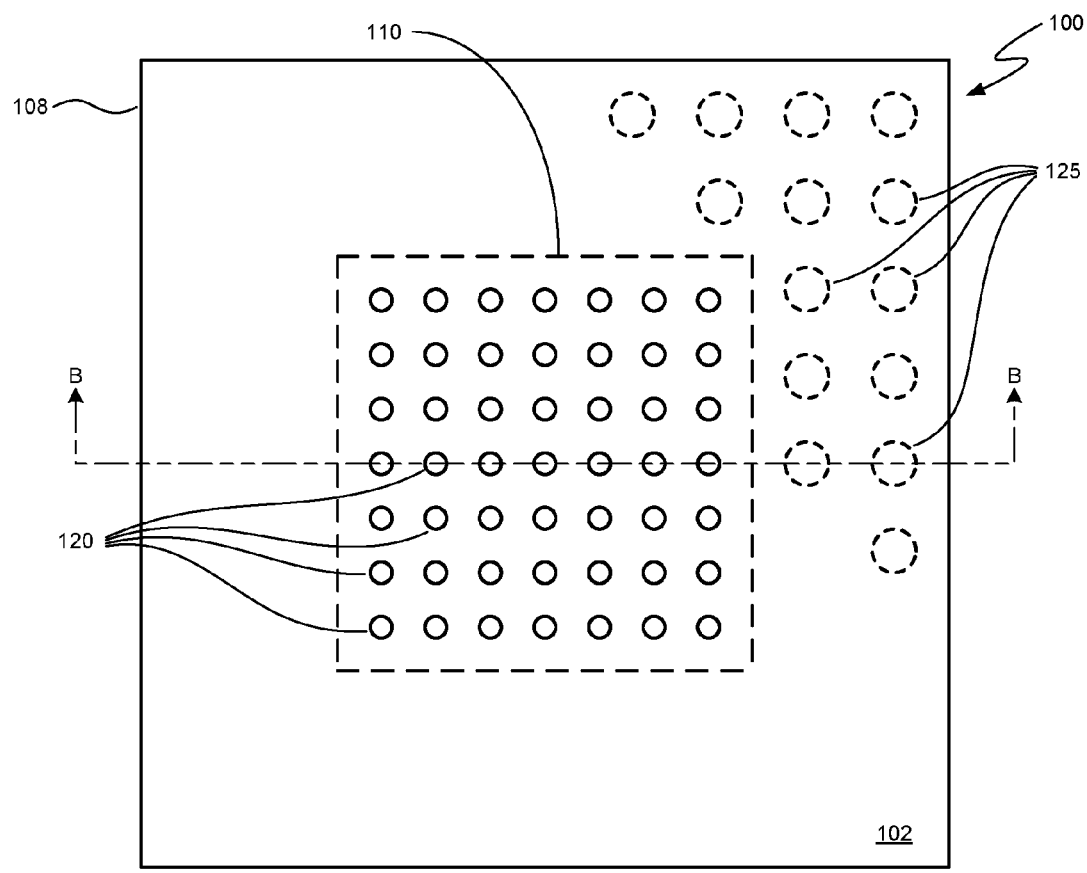
FIG. 1A is a schematic diagram showing a plan view of one embodiment of a substrate having a multi-layer glass core.

Disclosed are embodiments of a substrate having a multi-layer glass core. One or more build-up layers may be disposed on each side of the multi-layer glass core, and electrical conductors extend through the core. The multi-layer glass core may comprise a number of discrete glass layers bonded together. The glass layers may be bonded together by adhesive layers, and the adhesive layers may comprise an organic material. Embodiments of methods of forming a substrate including a multi-layer glass core and having conductors extending through the core's thickness, as well as embodiments of methods of forming a multi-layer glass core, are described below. Also disclosed are embodiments of an assembly including an integrated circuit die disposed on a substrate with a multi-layer glass core and coupled with the substrate by a set of interconnects.

As noted above, the disclosed embodiments encompass a substrate having a core comprised of multiple layers of glass. According to one embodiment, the term "glass" refers to an amorphous solid. Examples of glass materials that may be used with the described embodiments include pure silica (e.g., approximately 100% $SiO_2$), soda-lime glass, borosilicate glass, and alumo-silicate glass. However, the disclosed embodiments are not limited to silica-based glass compositions, and glasses having alternative base materials (e.g., fluoride glasses, phosphate glasses, chalcogen glasses, etc.) may also be employed with the disclosed embodiments. Further, any combination of other materials and additives may be combined with silica (or other base material) to form a glass having desired physical properties. Examples of these additives include not only the aforementioned calcium carbonate (e.g., lime) and sodium carbonate (e.g., soda), but also magnesium, calcium, manganese, aluminum, lead, boron, iron, chromium, potassium, sulfur, and antimony, as well as carbonates and/or oxides of these and other elements. The aforementioned glasses and additives are but a few examples of the many types of materials and material combinations that may find application with the disclosed embodiments. In addition, a glass layer or structure may include surface treatments and/or coatings to improve strength and/or durability, and a glass layer or structure may also be annealed to lower internal stresses.

Generally, as used herein, the term "glass" does not refer to organic polymer materials, which may be amorphous in solid form. However, it should be understood that a glass according to some embodiments may include carbon as one of the material's constituents. For example, soda-lime glass, as well as numerous variations of this glass type, comprise carbon.

A glass, once formed into a solid body, is capable of being softened and perhaps remelted into a liquid form. The "glass transition temperature" of a glass material is a temperature below which the physical properties of the glass are similar to those of a solid and above which the glass material behaves like a liquid. If a glass is sufficiently below the glass transition temperature, molecules of the glass may have little relative mobility. As a glass approaches the glass transition temperature, the glass may begin to soften and with increasing temperature the glass will ultimately melt into the liquid state. Thus, a glass body may be softened to an extent sufficient to enable manipulation of the body's shape, allowing for the formation of holes or other features in the glass body.

According to one embodiment, the "softening temperature" of a glass is temperature at which the glass has softened to an extent sufficient to enable the disclosed embodiments to be performed. For example, in one embodiment, the softening temperature of a glass is the temperature at which the glass is sufficiently soft to allow for formation of holes (or vias) or other features in the glass. The glass transition and softening temperatures are unique properties of a glass, although two or more different glass materials may have similar glass transition and/or softening temperatures. Further, it should be understood that the glass transition temperature and softening temperature of a particular glass may not necessarily be the same value.

Figure 1B:
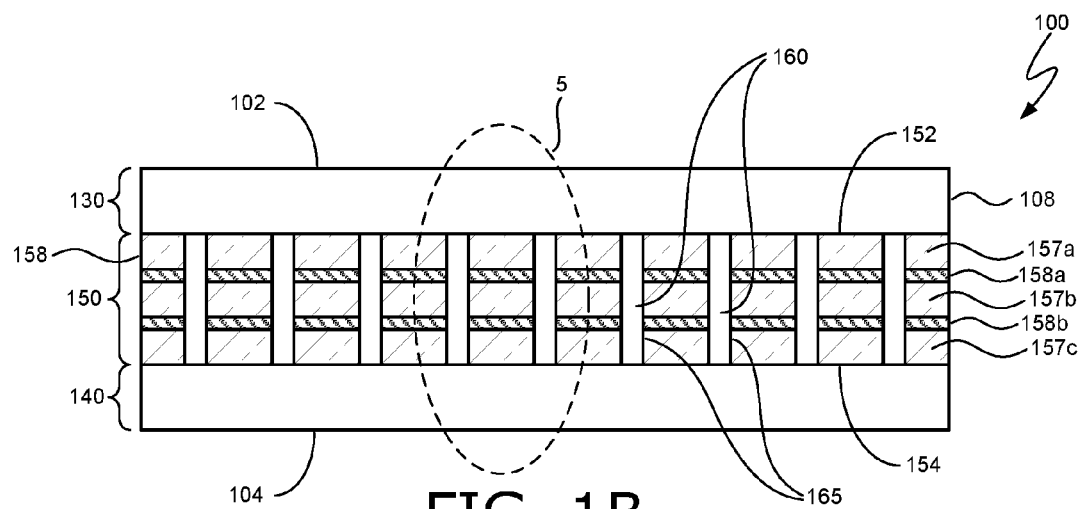
FIG. 1B is a schematic diagram showing a cross-sectional elevation view of the substrate having a multi-layer glass core shown in FIG. 1A, as taken along line B-B of FIG. 1A.

Turning now to FIGS. 1A and 1B, illustrated are embodiments of a substrate 100 having a core 150 comprised of two or more layers of glass. A plan view of the substrate 100 is shown in FIG. 1A, whereas a cross-sectional elevation view of the substrate is shown in FIG. 1B, as taken along line B-B of FIG. 1A. Also, various alternative embodiments of the substrate 100 having a multi-layer glass core are shown in each of FIGS. 1C through 1G, and each of FIGS. 1C through 1G shows a portion of the substrate 100, identified generally by reference numeral 5 in FIG. 1B, in an enlarged view.

With reference to FIGS. 1A and 1B, the substrate 100 includes a core 150 comprised of a number of glass layers 157a, 157b, and 157c. In one embodiment, the core 150 further includes bonding layers 158a and 158b disposed between the glass layers 157a, 157b, 157c (e.g., layer 158a is disposed between glass layers 157a, 157b, and so on). Substrate 100 includes a first side 102 and an opposing second side 104 generally parallel with the first side 102. A periphery 108 of substrate 100 extends between the first and second sides 102, 104. According to some embodiments, the periphery 108 of the substrate 100 is generally rectangular, and in one embodiment all four sides of the periphery 108 are substantially equal such that the periphery forms a square. However, it should be noted that a substrate having a non-rectangular periphery is within the scope of the disclosed embodiments. In one embodiment, the substrate 100 has a thickness of between 0.2 mm and 1.1 mm.

The multi-layer glass core 150 has a first surface 152 and an opposing second surface 154. In one embodiment, the first and second surfaces 152, 154 are generally parallel to each other. A periphery 158 of the glass core 150 extends between the first and second surfaces 152, 154, and in some embodiments the glass core's periphery 158 generally corresponds to the substrate's periphery 108. According to one embodiment, the multi-layer glass core 150 may have a thickness between 50 micrometers and 800 micrometers. The individual glass layers 157a, 157b, 157c may comprise any suitable type of glass. In one embodiment, the glass layers 157a-c comprise the same glass material; however, in other embodiments any one of the glass layers 157a-c may comprise a glass material that is different than the glass material of any of the other glass layers.

A number of conductors 160 extend through the multi-layer glass core 150. Each conductor 160 is disposed in a hole or via 165, and each conductor 160 may extend from the first surface 152 to the second surface 154. In other embodiments, however, one or more of the conductors extends only partially through the core's thickness. According to one embodiment, a conductor 160 comprises a hole or via 165 formed through the core 150 that has been filled with an electrically conductive material.

Conductors 160 may comprise any suitable electrically conductive material, including metals, composite materials, and electrically conductive polymers. Suitable metals include copper, tin, silver, gold, nickel, aluminum, and tungsten, as well as alloys of these and/or other metals. Processes that may be utilized to form a hole or via 165 include, for example, etching, laser drilling, imprinting, and sand blasting. Electrically conductive material may be deposited in the holes or vias 165 to form conductors 160 by any suitable process, such as, for example, plating techniques (electroplating or electroless plating), chemical vapor deposition (CVD), physical vapor deposition (PVD), or screen printing techniques, as well as any combination of these and/or other processes. Various embodiments of the formation of holes 165 and the formation of conductors 160 are described in greater detail below.

Disposed on the first side 102 of substrate 100 is a first set of electrically conductive terminals 120 (see FIG. 1A). According to one embodiment, the first set of terminals 120 is arranged in a pattern to mate with a corresponding array of terminals disposed on an integrated circuit (IC) die. An IC die is not shown in FIGS. 1A-1B; however, a die region 110 is depicted in FIG. 1A and the terminals 120 lie within this die region (sometimes referred to as a die shadow region). The terminals 120 may each comprise any suitable type of structure capable of forming an electrical connection with a terminal of the IC die. For example, a terminal 120 may comprise a pad, pillar, or stud bump formed from any suitable metal or combination of metals (e.g., aluminum, copper, nickel, etc.), and a solder bump may be disposed on each terminal 120 (and/or on the terminals of the IC die). In one embodiment, an IC die may be disposed on the substrate 100 in a flip-chip manner, and the terminals on the die coupled with the terminals 120 on the substrate 100 by a solder reflow process. According to another embodiment, an IC die may be coupled to the substrate 100 by a layer of adhesive, and terminals on the die electrically coupled to corresponding terminals on the substrate by a wirebond process (in this embodiment, the terminals 120 would lie outside the die region 110).

Disposed on the second side 104 of substrate 100 is a second set of electrically conductive terminals 125 (only a portion being shown in FIG. 1A for clarity and ease of illustration). According to one embodiment, the second set of terminals 125 is arranged in a pattern to mate with a corresponding array of terminals disposed on a next level component, such as a mainboard, a motherboard, or other circuit board (not shown in the figures). The terminals 125 may each comprise any suitable type of structure capable of forming an electrical connection with a terminal of the next-level component. By way of example, a terminal 125 may comprise a pad, land, solder bump or other metal bump, or a pin. The next-level component may include a socket (and retention mechanism) to receive the substrate 100 and terminals 125, such as a Land Grid Array (LGA) socket or a Pin Grid Array (PGA) socket. Alternatively, the terminals 125 may be coupled with terminals on the next level component by a solder reflow process.

Disposed on the first surface 152 of core 150 is a first build-up structure 130, and disposed on the core's second surface 154 is a second build-up structure 140. The first build-up structure comprises one or more alternating layers of a dielectric material and a metal, and the terminals 120 are disposed on the first build-up structure 130 (the first substrate side 102 generally corresponding to an outer surface of the first build-up structure 130). At least one of the conductors 160 in multi-layer glass core 150 is electrically coupled with at least one metal layer of the first build-up structure 130, and in one embodiment a metal layer of the first build-up structure nearest the core 150 is coupled with at least one conductor 160. Similarly, the second build-up structure 140 comprises one or more alternating layers of a dielectric material and a metal, and the terminals 125 are disposed on the second build-up structure 140 (the second substrate side 104 generally corresponding to an outer surface of the second build-up structure 140). At least one of the conductors 160 in core 150 is electrically coupled with at least one metal layer of the second build-up structure 140, and in one embodiment a metal layer of the second build-up structure nearest the core 150 is coupled with at least one conductor 160. The first and second build-up structures 130, 140 route power, as well as input/output (I/O) signals, between the first and second sets of terminals 120, 125 (and, hence, facilitate the delivery of power and signaling between an IC die mounted on substrate 100 and a next-level component). Build-up structures 130, 140 are described in greater detail below.

Figure 1C:
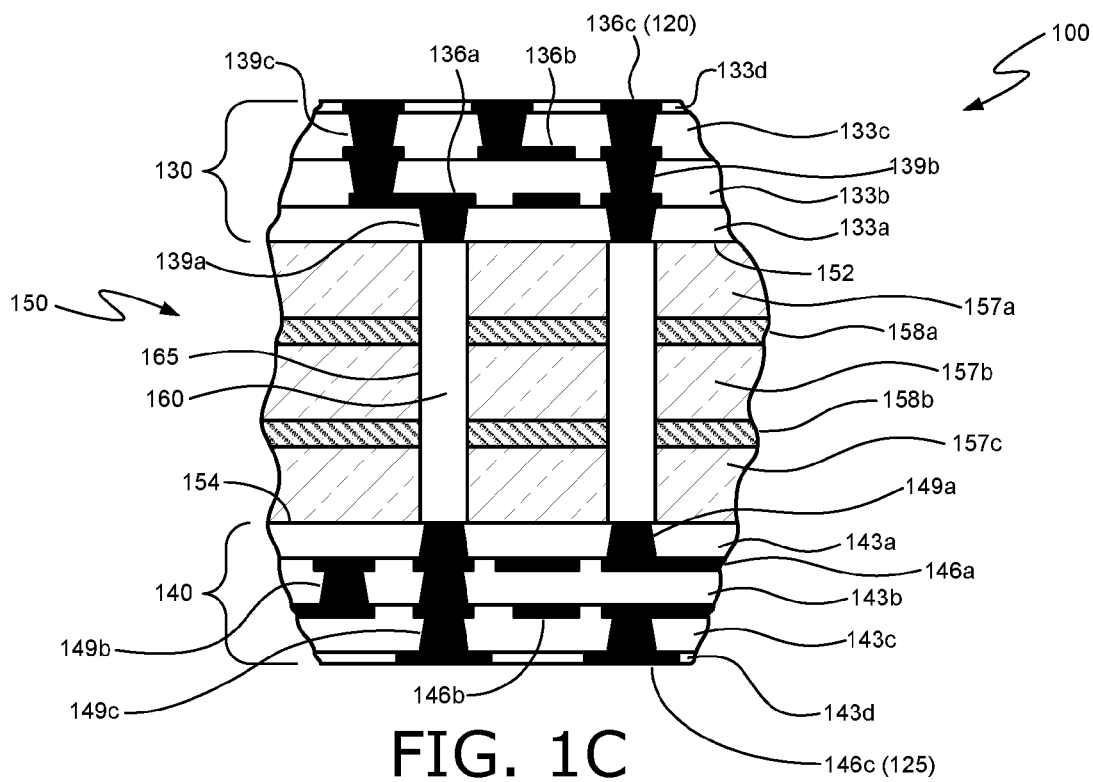
FIG. 1C is a schematic diagram showing a portion of the cross-sectional elevation view of FIG. 1B and illustrating another embodiment of the substrate having a multi-layer glass core.

Referring to FIG. 1C, an embodiment of the multi-layer glass core substrate 100 is illustrated in greater detail. As previously described, the substrate includes a core 150 comprised of glass layers 157a, 157b, and 157c, with the core having a first surface 152 and an opposing second surface 154. Bonding layers 158a, 158b are disposed between the glass layers 157a-c, as noted above. Although three glass layers are shown in FIGS. 1A through 1G, the core 150 may comprise any suitable number of glass layers (e.g., two layers, four or more layers, etc.), depending upon the desired mechanical and electrical characteristics of the substrate 100. The glass layers 157a-c may have any suitable thickness, and in one embodiment each glass layer has a thickness of between approximately 50 and 200 micrometers. Also, in one embodiment the glass layers 157a-c may all have the same thickness (as depicted in the figures), or alternatively any one of the glass layers 157a-c may have a thickness different than one or more of the other glass layers. Bonding layers 158a-b may also have any suitable thickness, and in one embodiment each bonding layer has a thickness of between approximately 20 and 100 micrometers. According to one embodiment, the bonding layers 158a-b all have the same thickness (as shown in the figures); however, in other embodiments any one of the bonding layers 158a-b may have a thickness different than one or more of the other bonding layers.

The discrete glass layers 157a, 157b, 157c may be bonded together by any suitable technique. In one embodiment, bonding layers 158a, 158b are disposed between the glass layers, and each of these layers is coupled with two adjacent glass layers (e.g., bonding layer 158a is coupled with glass layers 157a and 157b, and so on). According to one embodiment, each bonding layer 158a, 158b includes an adhesive, and in a further embodiment the bonding layers 158a, 158b comprise an organic material. In one embodiment, each bonding layer 158a, 158b comprises a dry film adhesive material, such as a film comprised of an acrylic resin or an epoxy resin. It should, however, be understood that the disclosed embodiments are not limited to adhesive bonding and, further, that the multi-layer glass core 150 may be formed without adhesives. In some embodiments, the glass layers 157a-c may be joined together by diffusion bonding. For example, in one embodiment, the bonding layers 158a-b comprise a material that is capable of forming a diffusion bond with the glass material of layers 157a-c (e.g., bonding layer 158a would form a diffusion bond with each of glass layers 157a and 157b, and so on). Alternatively, the glass layers 157a-157c may be diffusion bonded directly to one another (e.g., glass layer 157a is diffusion bonded with glass layer 157b, and so on), in which case the bonding layers 158a-b may be omitted. In other embodiments, the glass layers 157a-c may be mechanically joined together. By way of example, in one embodiment, the conductive material 160 deposited in thru-holes 165 may function to secure the glass layers 158a-158c together. In a further embodiment, glass layers 157a-c may be secured together using direct oxide-to-oxide bonding.

According to one embodiment, first build-up structure 130 comprises a number of dielectric material layers 133a, 133b, 133c, 133d, and a number of metal layers 136a, 136b, 136c. Dielectric layers 133a-d may comprise any suitable dielectric material (e.g., polymer materials, etc.) and may be formed by any suitable technique (e.g., by deposition, lamination, etc.). Metal layers 136a-c may comprise any suitable electrically conductive metal (e.g., copper, aluminum, silver, etc.), and may be deposited by any suitable technique (e.g., plating processes, such as electroplating and electroless plating). Further, the metal layers 136a-c may each be patterned to form any suitable number and configuration of traces, power planes, ground planes, and other conductors to facilitate the routing of power and I/O signals.

One of the dielectric layers 133a-d is disposed between any two adjacent metal layers 136a-c (e.g., metal layers 136a and 136b are separated by dielectric layer 133b, and so on), and dielectric layer 133a lies adjacent the core 150 and separates the metal layer 136a from the core. According to one embodiment, the dielectric layer 133a lies directly adjacent the core's first surface 152. Vias 139a, 139b, 139c—which are plated or filled with metal—extend through the dielectric layers 133a, 133b, 133c, respectively, and interconnect adjacent metal layers (e.g., vias 139b interconnect metal layers 136a and 136b, and so on). Further, the metal layer 136a nearest the multi-layer glass core 150 is coupled with one or more of the conductors 160 by vias 139a disposed in dielectric layer 133a. In one embodiment, the first surface 152 of core 150 may include a surface treatment or coating to increase adhesion with the dielectric material of the build-up structure 130. Also, in some embodiments, the outermost dielectric layer 133d may comprise a resist layer and/or a passivation layer. Also, according to one embodiment, terminals 120 are formed by, or formed on, the outermost metal layer 136c.

In one embodiment, second build-up structure 140 comprises a number of dielectric material layers 143a, 143b, 143c, 143d, and a number of metal layers 146a, 146b, 146c. Dielectric layers 143a-d may comprise any suitable dielectric material (e.g., polymer materials, etc.) and may be formed by any suitable technique (e.g., by deposition, lamination, etc.). Metal layers 146a-c may comprise any suitable electrically conductive metal (e.g., copper, aluminum, silver, etc.), and may be deposited by any suitable technique (e.g., plating processes, such as electroplating and electroless plating). Further, the metal layers 146a-c may each be patterned to form any suitable number and configuration of traces, power planes, ground planes, and other conductors to facilitate the routing of power and I/O signals.

One of the dielectric layers 143a-d is disposed between any two adjacent metal layers 146a-c (e.g., metal layers 146a and 146b are separated by dielectric layer 143b, and so on), and dielectric layer 143a lies adjacent the core 150 and separates the metal layer 146a from the core. According to one embodiment, the dielectric layer 143a lies directly adjacent the core's second surface 154. Vias 149a, 149b, 149c—which are plated or filled with metal—extend through the dielectric layers 143a, 143b, 143c, respectively, and interconnect adjacent metal layers (e.g., vias 149b interconnect metal layers 146a and 146b, and so on). Further, the metal layer 146a nearest the multi-layer glass core 150 is coupled with one or more of the conductors 160 by vias 149a disposed in dielectric layer 143a. In one embodiment, the second surface 154 of core 150 may include a surface treatment or coating to increase adhesion with the dielectric material of the build-up structure 140. Also, in some embodiments, the outermost dielectric layer 143d may comprise a resist layer and/or a passivation layer. In addition, in one embodiment, terminals 125 are formed by, or formed on, the outermost metal layer 146c.

In the embodiment of FIG. 1C (as well as the embodiments shown in each of FIGS. 1D and 1G), the first and second build-up structures have the same number of dielectric and metal layers and, further, have generally equivalent thicknesses. However, the disclosed embodiments are not so limited, and in other embodiments the first and second build-up structures may have differing thicknesses and/or differing numbers of dielectric and metal layers. According to another embodiment, a build-up structure is disposed on only one side of the multi-layer glass core 150. Also, in some embodiments, the first and second build-up structures are constructed from the same dielectric material and metal. In other embodiments, however, the first and second build-up structures may have differing materials.

Figure 1D:
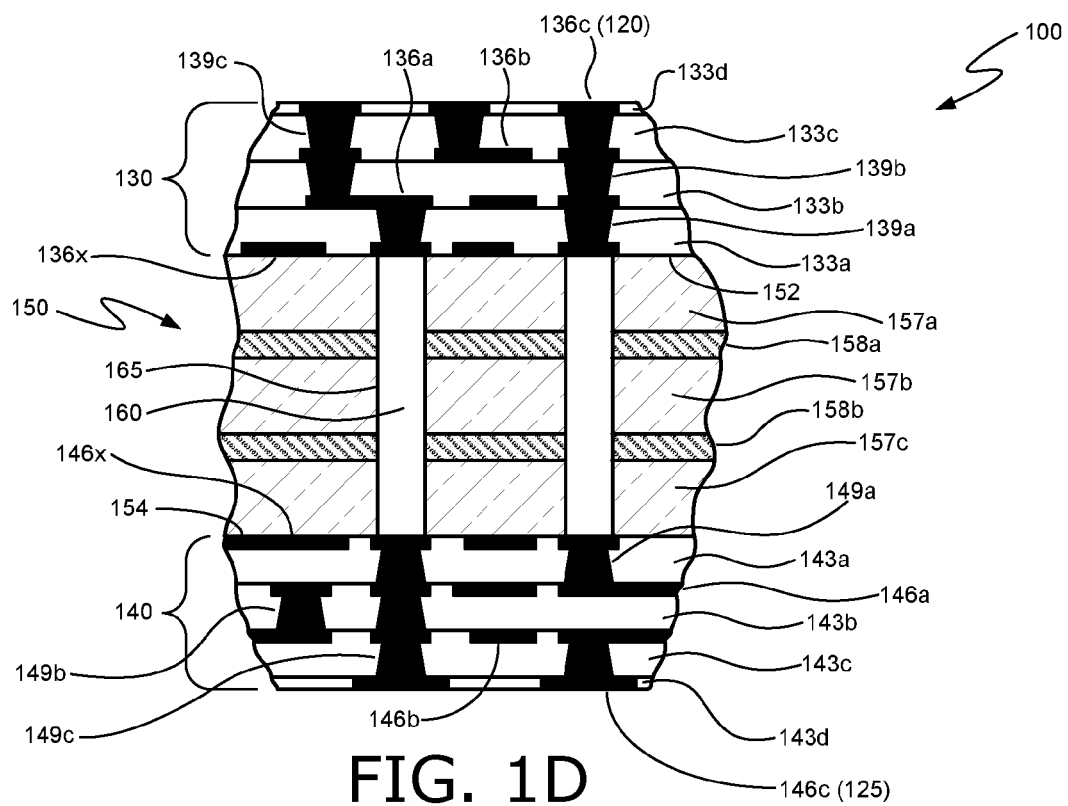
FIG. 1D is a schematic diagram showing a portion of the cross-sectional elevation view of FIG. 1B and illustrating a further embodiment of the substrate having a multi-layer glass core.

In the embodiment of FIG. 1C, dielectric layers 133a and 143a are positioned adjacent the multi-layer glass core 150, and the metal layers nearest the core (i.e., metal layers 136a and 146a) are separated from the core by these dielectric layers. In an alternative embodiment, as illustrated in FIG. 1D, a metal layer may lie adjacent the multi-layer glass core 150. The incorporation of a metal layer adjacent one or both sides of the core 150 is sometimes referred to as "core layer routing."

Referring to FIG. 1D, the embodiment of substrate 100 is generally similar to that shown in FIG. 1C (and like features are identified by the same reference numerals). However, in the embodiment of FIG. 1D, the first build-up structure 130 includes a metal layer 136x adjacent the multi-layer glass core 150, and according to one embodiment the metal layer 136x is directly adjacent the core's first surface 152. Dielectric layer 133a overlies the metal layer 136x (and exposed portions of the core), this metal layer 136x now being the metal layer nearest the core, and at least one of the conductors 160 is coupled with metal layer 136x. Further, in another embodiment, the first surface 152 of core 150 may include a surface treatment or coating to increase adhesion with the metal layer 136x (and perhaps with portions of dielectric layer 133a).

Similar to first build-up structure 130, the second build-up structure 140 of FIG. 1D includes a metal layer 146x adjacent the multi-layer glass core 150, and in one embodiment the metal layer 146x is directly adjacent the core's second surface 154. Dielectric layer 143a overlies the metal layer 146x (and exposed portions of the glass core), this metal layer 146x now being the metal layer nearest the core, and at least one of the conductors 160 is coupled with metal layer 146x. In addition, in another embodiment, the second surface 154 of core 150 may include a surface treatment or coating to increase adhesion with the metal layer 146x (and perhaps with portions of dielectric layer 143a). In some embodiments, only one of the core's opposing surfaces 152, 154 has an adjacent metal layer (e.g., either one of metal layers 136x, 146x in the first and second build-up structures 130, 140, respectively, may be omitted).

Figure 1E:
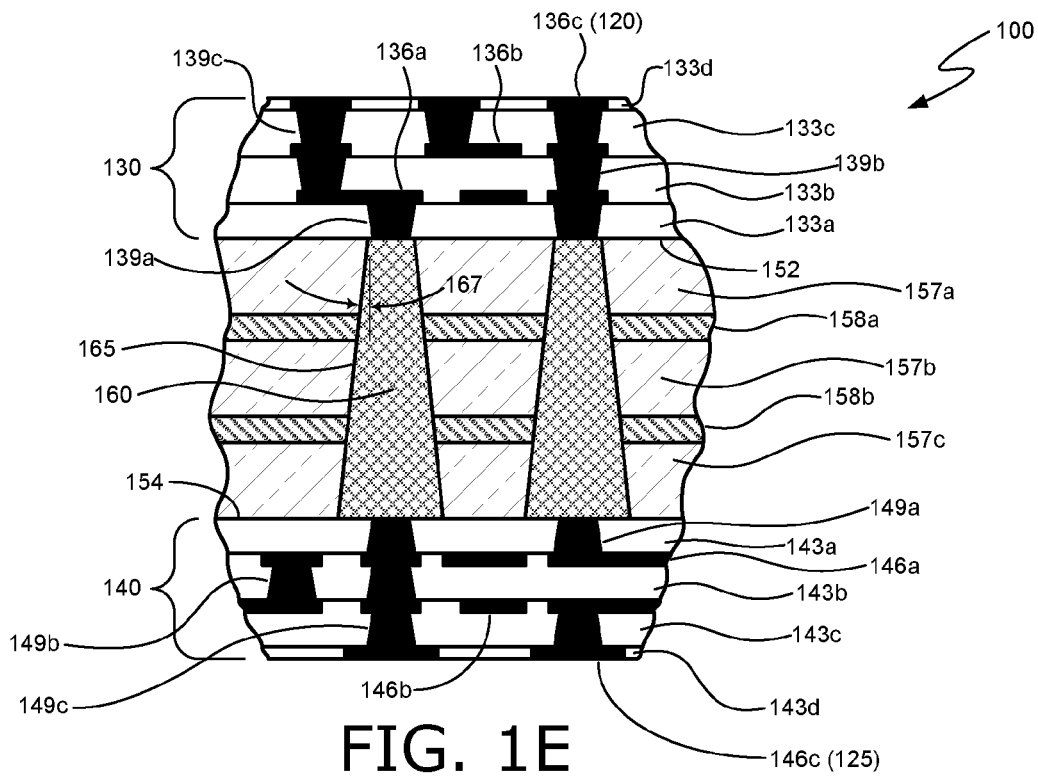
FIG. 1E is a schematic diagram showing a portion of the cross-sectional elevation view of FIG. 1B and illustrating yet another embodiment of a substrate having a multi-layer glass core.

With reference now to FIG. 1E, a further embodiment of multi-layer glass core substrate 100 is illustrated. The embodiment of substrate 100 show in FIG. 1E is generally similar to that shown in FIG. 1C (and like features are identified by the same reference numerals). However, in the embodiment of FIG. 1E, the hole or via 165 in which each conductor 160 is disposed has a wall that is tapered through the thickness of the core 150. In one embodiment, the tapered wall of hole or via 165 has an angle 167 relative to a centerline of the hole of between 0 and 45 degrees. The tapered wall of a hole 165 may be the result of the process used to form the hole through the multi-layer glass core 150. As noted above, processes that may be utilized to form a hole or via 165 include, for example, etching, laser drilling, imprinting, and sand blasting. Depending upon the processing conditions, any one of the aforementioned techniques may form a hole 165 having a tapered wall. It should be understood that, depending upon the formation technique and process conditions, a via may have a shape other than the straight tapered wall depicted in FIG. 1E. For example, in other embodiments, the walls of a via may be curved (e.g., a via may have a scalloped cross-sectional profile).

Figure 1F:
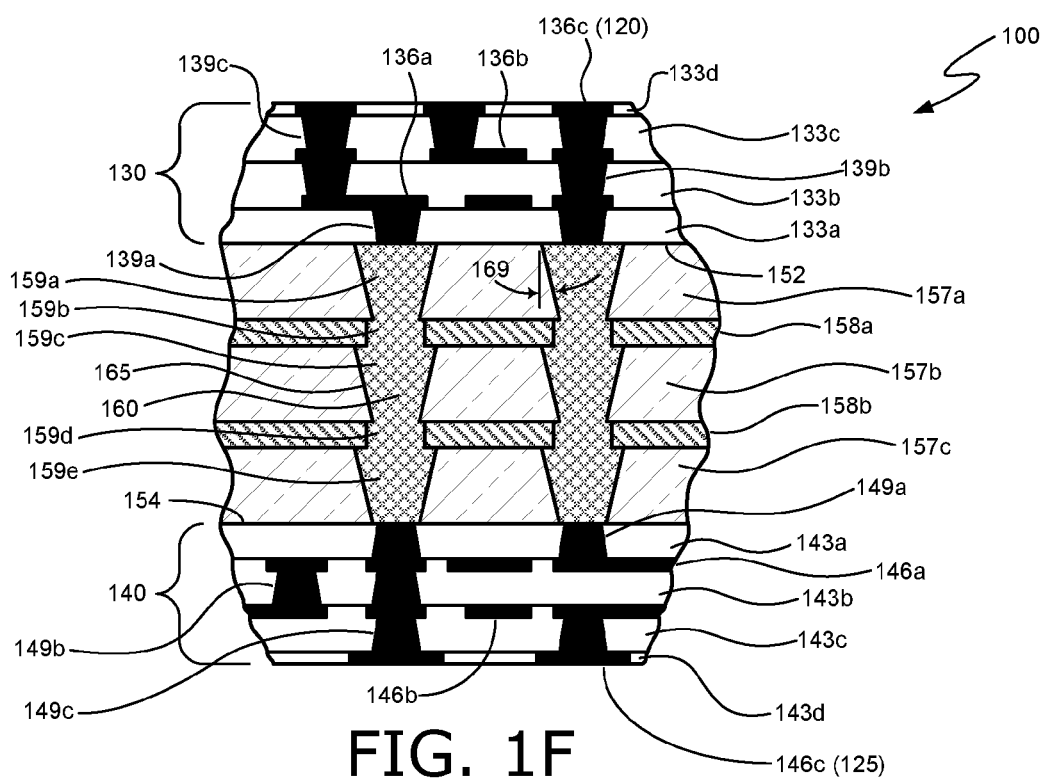
FIG. 1F is a schematic diagram showing a portion of the cross-sectional elevation view of FIG. 1B and illustrating yet a further embodiment of a substrate having a multi-layer glass core.

Turning next to FIG. 1F, a further embodiment of the multi-layer glass core substrate 100 is illustrated. The embodiment of substrate 100 show in FIG. 1E is generally similar to that shown in FIG. 1C (and like features are identified by the same reference numerals). However, in the embodiment of FIG. 1F, the hole or via 165 in which each conductor 160 is disposed comprises a number of separate, aligned holes formed in each of the discrete glass layers 157a, 157b, 157c and bonding layers 158a, 158b. For example, a thru-hole 165 may comprise a via 159a in glass layer 157a, a via 159b in bonding layer 158a, a via 159c in glass layer 157b, a via 159d in bonding layer 158b, and a via 159e in glass layer 157c. Generally, these separate holes 159a-e are aligned along a common centerline; however, in some embodiments there may be misalignment between these separate holes.

According to one embodiment, the vias formed in the glass layers (e.g., vias 159a, 159c, 159e and perhaps bonding layers 158a, 158b) may have a wall that is tapered through the thickness of that glass layer (or bonding layer). In one embodiment, the tapered wall of a via has an angle 169 relative to a centerline of the hole of between 0 and 45 degrees. The tapered wall of a via (e.g., a via 159a-e) may be the result of the formation process. As noted above, processes that may be utilized to form a via through a glass layer (and through a bonding layer) include, for example, etching, laser drilling, imprinting, and sand blasting. Depending upon the processing conditions, any one of the aforementioned techniques may form a via having a tapered wall. It should be understood that, depending upon the formation technique and process conditions, a via may have a shape other than the straight tapered wall depicted in FIG. 1F. In other embodiments, the walls of a via may be curved. For example, a via may have a scalloped cross-sectional profile (see, e.g., FIG. 8J).

Figure 1G:
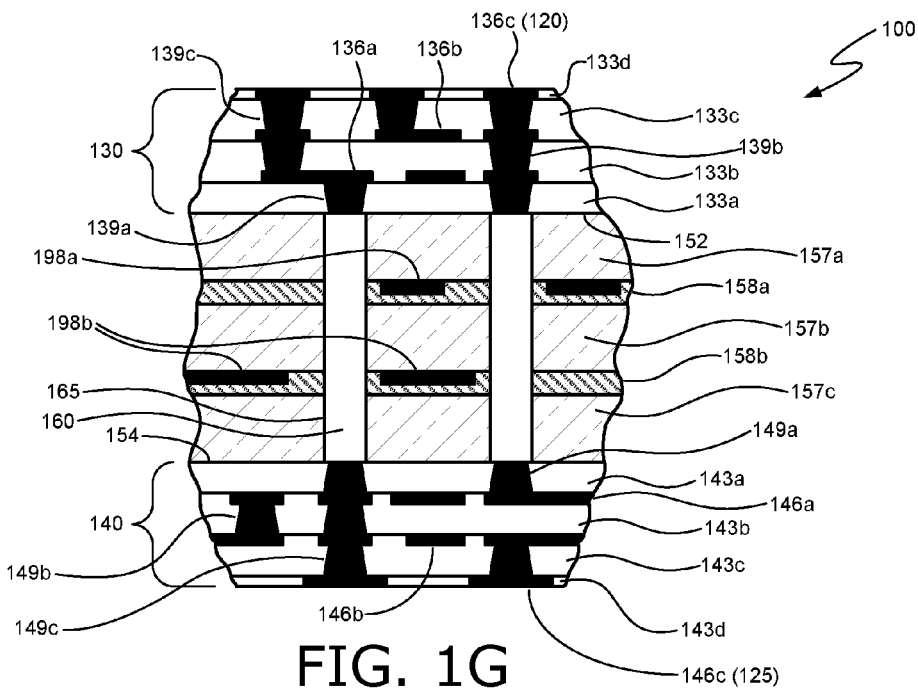
FIG. 1G is a schematic diagram showing a portion of the cross-sectional elevation view of FIG. 1B and illustrating another alternative embodiment of a substrate having a multi-layer glass core.

With reference now to FIG. 1G, a further embodiment of multi-layer glass core substrate 100 is illustrated. The embodiment of substrate 100 show in FIG. 1G is generally similar to that shown in FIG. 1C (and like features are identified by the same reference numerals). However, in the embodiment of FIG. 1G, any one or more of the bonding layers 158a, 158b may include conductors. For example, bonding layer 158a may include conductors 198a, and bonding layer 158b may include conductors 198b. The conductors 198a, 198b may comprise traces for routing I/O signals and/or for routing power. Further, the conductors 198a, 198b on any one or more of the bonding layers 158a, 158b may comprise a power plane or a ground plane. Conductors 198a, 198b may comprise any suitable electrically conductive material, such as a metal (e.g., copper, nickel, aluminum, silver, gold, as well as alloys of these and/or other metals), a conductive polymer, or a composite material. Also, although both bonding layers 158a, 158b in FIG. 1G include conductors, in other embodiments not all bonding layers will include conductors.

Figure 2:
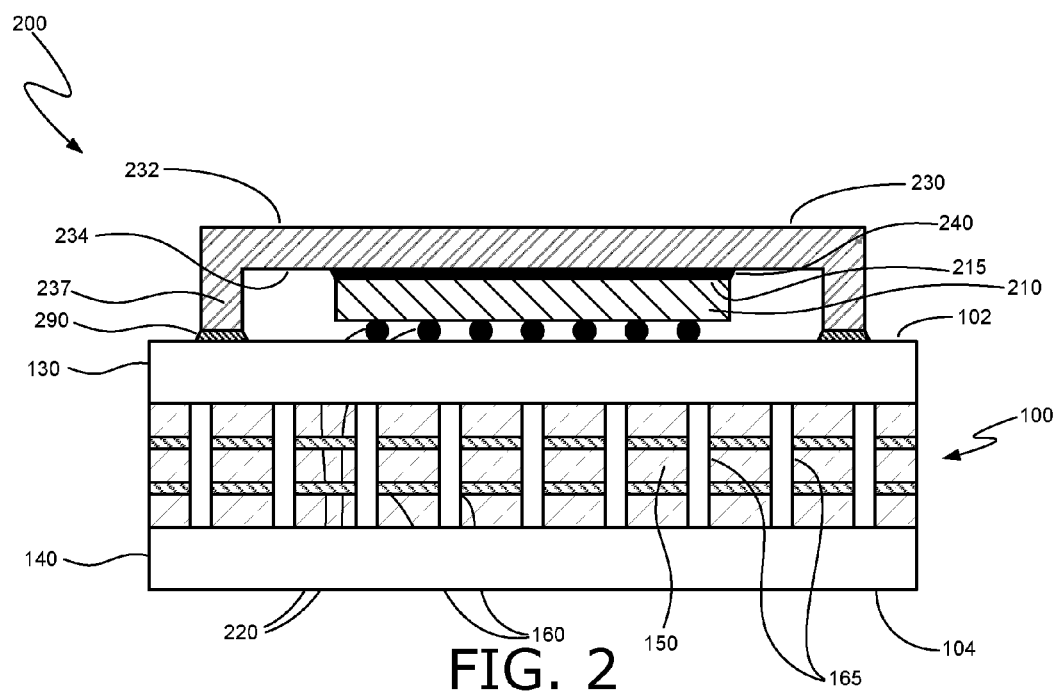
FIG. 2 is a schematic diagram showing a cross-sectional elevation view of an integrated circuit assembly including an embodiment of a substrate having a multi-layer glass core.

Illustrated in FIG. 2 is an embodiment of an assembly 200 including a multi-layer glass core substrate 100. With reference to FIG. 2, the assembly 200 includes substrate 100 having a multi-layer glass core 150, as well as a first side 102 and an opposing second side 104. Disposed on the substrate's first side 102 is an integrated circuit (IC) die 210. The IC die 210 is electrically (and mechanically) coupled with the substrate 100 by a number of interconnects 220. Terminals 125 (e.g., lands, pins, solder bumps, etc.) on the substrates second side 104 (see FIG. 1A) may be used to form electrical connections with a next-level component, such as a motherboard, mainboard, or other circuit board. A heat spreader or lid 230—having a first surface 232 and an opposing second surface 234 that faces a back surface 215 of the die—is disposed over the die 210 and thermally coupled with (and perhaps mechanically coupled with) the die's back surface 215 by a layer of thermal interface material 240. An adhesive or sealant 290 may be used to secure the heat spreader 230 to the first surface 102 of glass core substrate 100. Although not shown in FIG. 2, in a further embodiment a heat sink (or other cooling device) may be thermally coupled with the heat spreader 230, and another layer of a thermal interface material may be disposed between the heat spreader's first surface 232 and the heat sink (or other device).

IC die 210 may comprise any type of semiconductor device. In one embodiment, the IC die 210 comprises a processing system or device. For example, IC die 210 may comprise a microprocessor or a graphics processor. The IC die 210 can perform instructions from any number of processor architectures having any number of instruction formats. In one embodiment, an instruction is an "x86" instruction, as used by Intel Corporation. However, in other embodiments, the processor may perform instructions from other architectures or from other processor designers. In another embodiment, the IC die 210 comprises a memory device. According to a further embodiment, the IC die 210 comprises a system-on-chip (SoC). In yet another embodiment, the IC die 210 may include digital circuitry, analog circuitry, or a combination of both analog and digital circuitry.

Interconnects 220 are formed by coupling terminals 120 on the substrate first surface 102 (see FIG. 1A) with terminals on the IC die 210 by, for example, a solder reflow process. As previously described, the substrate terminals 120 may each comprise a pad, pillar, or stud bump formed from any suitable metal or combination of metals (e.g., copper, nickel, aluminum, etc.), and the die terminals may also comprise a pad, pillar, or stud bump formed from any suitable metal or combination of metals. Solder (e.g., in the form of balls or bumps) may be disposed on the substrate and/or die terminals, and these terminals may then be joined using a solder reflow process. It should be understood that the aforementioned interconnects are but one example of the type of interconnects that can be formed between substrate 100 and IC die 210 and, further, that any other suitable type of interconnect may be utilized. In addition, a layer of underfill material (not shown in FIG. 2) may be disposed around the interconnects 220 and between the IC die 210 and the substrate's first side 102.

Heat spreader 230 may be comprised of any suitable thermally conductive materials and may have any suitable shape or structure. According to one embodiment, the heat spreader 230 comprises a lid having a side wall (or walls) 237 extending towards the substrate's first side 102, with this wall (or walls) being secured to the substrate surface 102 by the adhesive 290. The above-describe lid is sometimes referred to as an integrated heat spreader, or IHS. Materials that may be used to construct the heat spreader 230 include metals (e.g., copper and alloys thereof), thermally conductive composites, and thermally conductive polymers.

In the embodiment illustrated in FIG. 2, the assembly 200 includes a single IC die 210. However, in other embodiments, the assembly 200 may comprise a multi-chip package. For example, one or more other integrated circuit die (e.g., a memory device, a voltage regulator, etc.) may be disposed on the substrate 100. In addition, passive devices, such as capacitors and inductors, may be disposed on the glass core substrate 100 or, alternatively, integrated into the build-up structures 130, 140 of the substrate. By way of example, an array capacitor or a thin-film capacitor may be integrated into the build-up structures 130, 140 of the substrate 100. In another embodiment, a wireless component, such as an antenna or an RF shield, may be disposed on glass core substrate 100 or integrated into the build-up structures 130, 140 of this substrate. These additional devices, whether IC die, passive devices, or other components, may be disposed on either side 102, 104 of the glass core substrate 100.

The assembly 200 may form part of any type of computing device. According to one embodiment, the assembly 200 may form part of a server or desktop computer. In another embodiment, the assembly 200 forms part of a lap-top computer or similar mobile computing device (e.g., a net-top computer). In a further embodiment, the assembly 200 comprises part of a hand-held computing device, such as a cell phone, a smart phone, or a mobile internet device (MID). In yet another embodiment, the assembly 200 forms part of an embedded computing device.

Figure 3:
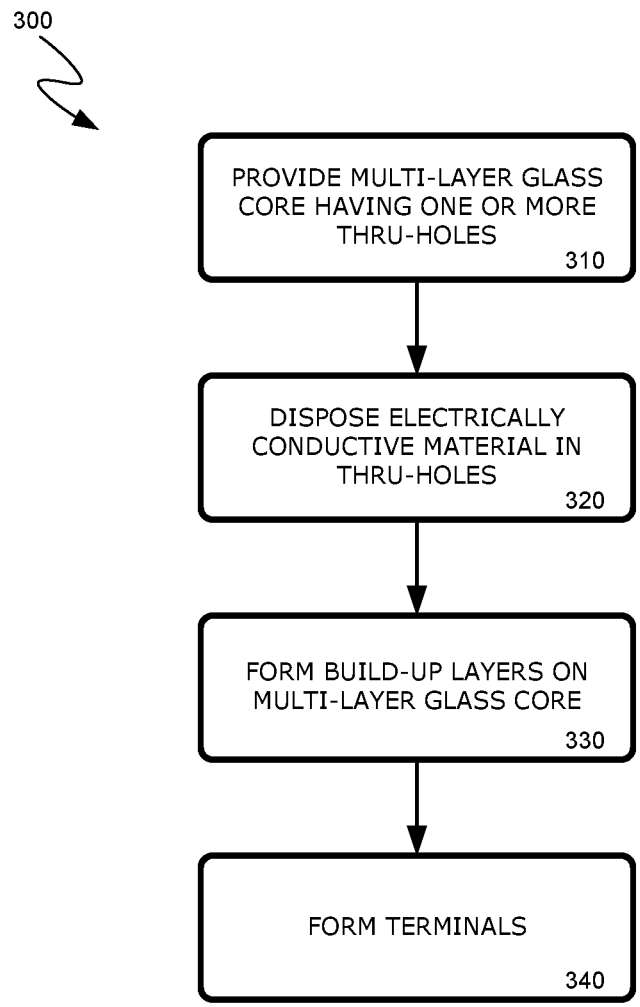
FIG. 3 is a block diagram illustrating embodiments of a method of forming a substrate having a multi-layer glass core.

Illustrated in FIG. 3 an embodiment of a method of making a multi-layer glass core substrate. The method of FIG. 3 is further illustrated in FIGS. 4A-4C, and reference should be made to these figures as called out in the text below.

Figure 4A:
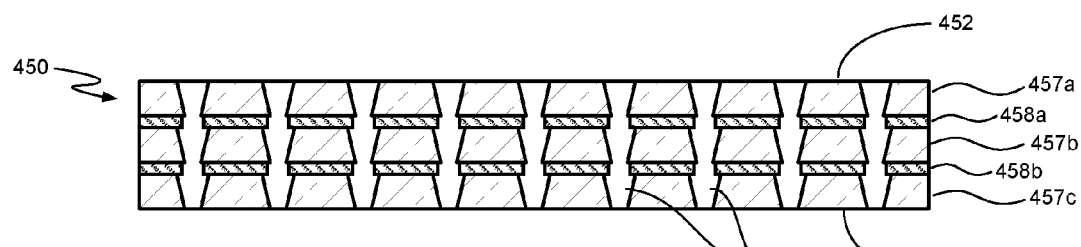
FIGS. 4A-4C are schematic diagrams illustrating embodiments of the method of FIG. 3.

Referring to block 310 in FIG. 3, in one embodiment a multi-layer glass core having one or more thru-holes is provided. This is illustrated in FIG. 4A, where a core 450 is shown. Multi-layer glass core 450 may comprise any of the embodiments of core 150 previously described and shown in FIGS. 1A though 1G. The multi-layer glass core 450 includes discrete glass layers 457a, 457b, 457c secured together by bonding layers 458a, 458b, with the core including a first surface 452 and an opposing second surface 454 that is generally parallel with first surface 452. Holes or vias 465 extend from the first surface 452 to second surface 454. The glass layers 457a-c of core 450 may comprise any suitable type of glass and have any suitable thickness (see discussion above), depending upon the application and/or desired characteristics. According to one embodiment, the core 450 is of a size and configuration to enable formation of a single substrate. In a further embodiment, the core 450 is of a size and configuration to enable the formation of two or more substrates (e.g., the core 450 comprises a panel from which two or more substrates will be cut). Various embodiments of a method of forming a multi-layer glass core, such as core 450, having one or more thru-holes are shown in each of FIGS. 5, 7, 9 and 11, and these embodiments will be described in greater detail below.

Figure 4B:
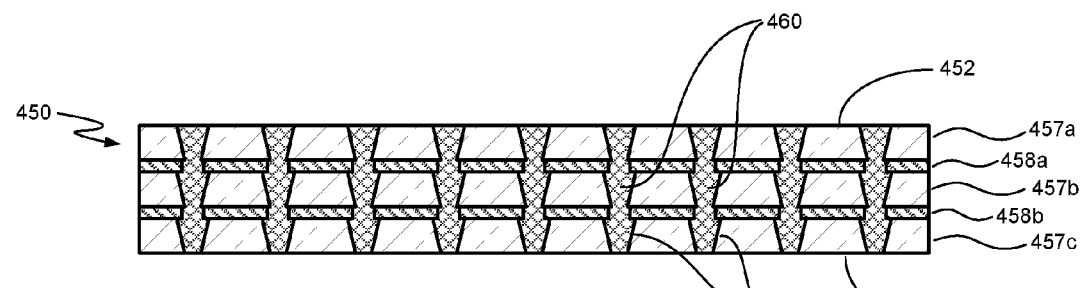

Referring to block 320, an electrically conductive material is disposed in the thru-holes to form conductors. This is illustrated in FIG. 4B, where an electrically conductive material has been disposed in the holes 465 to form conductors 460. The electrically conductive material 460 may be deposited in the vias 465 by any suitable process, such as, for example, plating techniques (electroplating or electroless plating), CVD, PVD, or screen printing techniques, as well as any combination of these and/or other processes. The material forming conductors 460 in core 450 may comprise any suitable electrically conductive material, including metals, composite materials, and electrically conductive polymers. Suitable metals include copper, tin, silver, gold, nickel, aluminum, and tungsten, as well as alloys of these and/or other metals.

Figure 13:
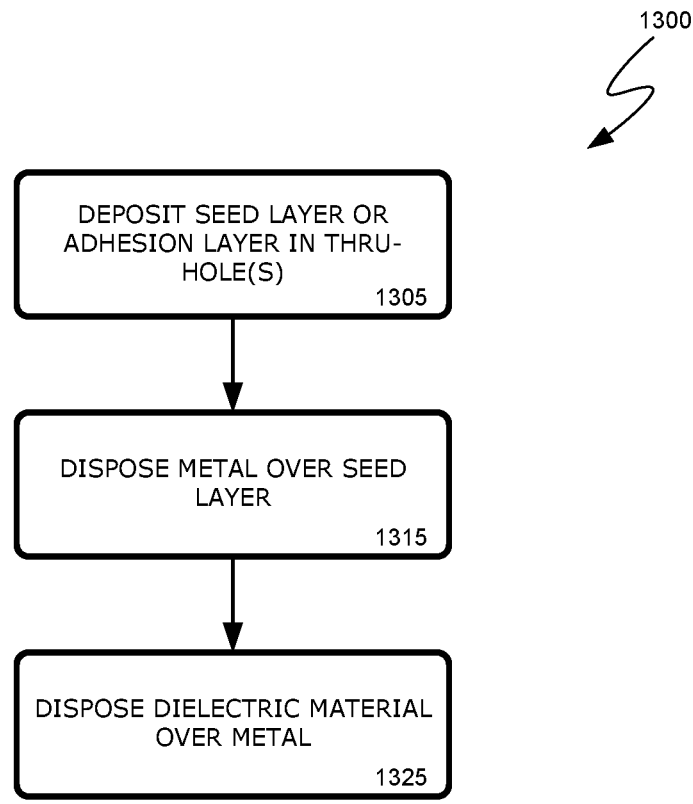
FIG. 13 is a block diagram illustrating embodiments of a method of disposing conductive material in thru-holes of a multi-layer glass core.

One embodiment of a method of forming conductors in the thru-holes of a multi-layer glass core is illustrated in FIG. 13, which will now be discussed. Embodiments of the method of FIG. 13 are further illustrated in the schematic diagrams of FIGS. 14A through 14C, and reference should be made to FIGS. 13 and 14A-14C as called out in the text below.

Turning now to block 1305 in FIG. 13, a seed layer or adhesion layer is disposed over the walls of thru-holes in a multi-layer glass core. This is further illustrated in FIG. 14A, which shows a core 1450. Core 1450 comprises glass layers 1458a, 1458b, 1458c, 1458d coupled together by bonding layers 1458a, 1458b, 1458c (e.g., bonding layer 1458a is coupled to both glass layers 1457a and 1457b, and so on). Thru-holes 1465 extend through core 1450 from a first surface 1452 to a second opposing surface 1454 of the core. The holes 1465 may be formed by any suitable method or combination of methods, such as etching, laser drilling, imprinting, and sand blasting. Disposed over walls of the thru-vias 1465 is a seed layer 1466. It should be noted that, in other embodiments, one or more other material layers may be deposited prior to seed layer 1466. For example, prior to deposition of seed layer 1466, a dielectric layer may be deposited over walls of thru-vias 1465 (e.g., to achieve desired capacitance, to achieve desired electrical isolation, etc.).

Figure 14A:
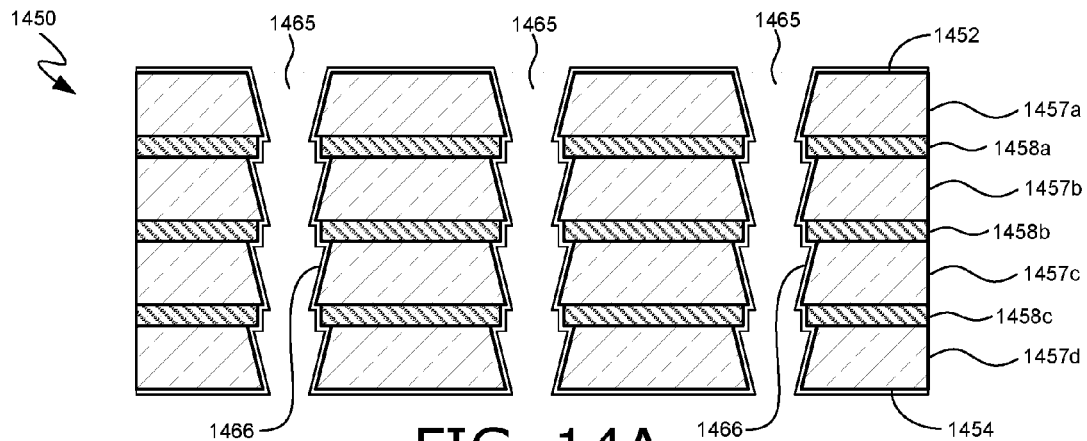
FIGS. 14A-14C are schematic diagrams illustrating embodiments of the method of FIG. 13.

A subsequent layer of metal will be deposited over the seed layer 1466, and the seed layer 1466 may comprise any material capable of adhering to the glass material of layers 1457a-d (and material of bonding layers 1457a-c) and to the subsequent layer of metal to be deposited. Suitable seed layer materials include copper, titanium, chromium, nickel, or vanadium, as well as alloys of these and/or other metals. Further, the seed layer 1466 may be deposited using any suitable technique, including electroless plating, electroplating, CVD, or PVD. In one embodiment, a blanket deposition technique is employed, and the seed layer 1466 may extend over the first and second surfaces 1452, 1454 of the core 1450, as shown in FIG. 14A. The seed layer 1466 may have any suitable thickness, and in one embodiment this layer has a thickness of between 0.1 micrometers and 0.5 micrometers.

Figure 14B:
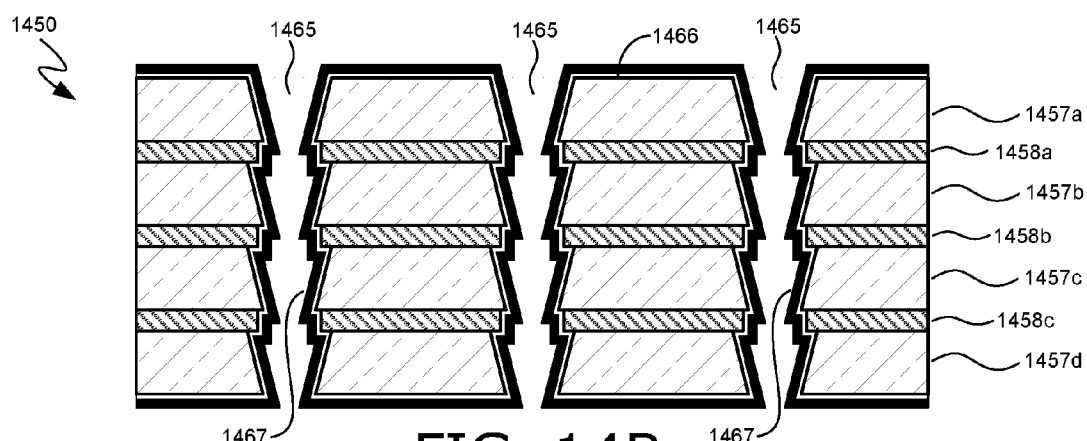

As set forth in block 1315, metal is disposed over the seed layer. This is illustrated FIG. 14B, where a metal layer 1467 has been disposed over the seed layer 1466. Metal layer 1467 may comprise any suitable electrically conductive metal, such as copper, aluminum, nickel, silver, or gold, as well as alloys of these and/or other metals. The metal layer 1467 may be deposited using any suitable technique, including electroless plating, electroplating, CVD, or PVD. In one embodiment, a blanket deposition technique is employed, and the metal layer 1467 may extend over the first and second surfaces 1452, 1454 of the core 1450, as shown in FIG. 14B. The metal layer 1467 may have any suitable thickness, and in one embodiment this layer has a thickness of between 5 micrometers and 30 micrometers. In another embodiment, the metal 1467 deposited over the seed layer 1466 substantially fills the thru-holes 1465.

Figure 14C:
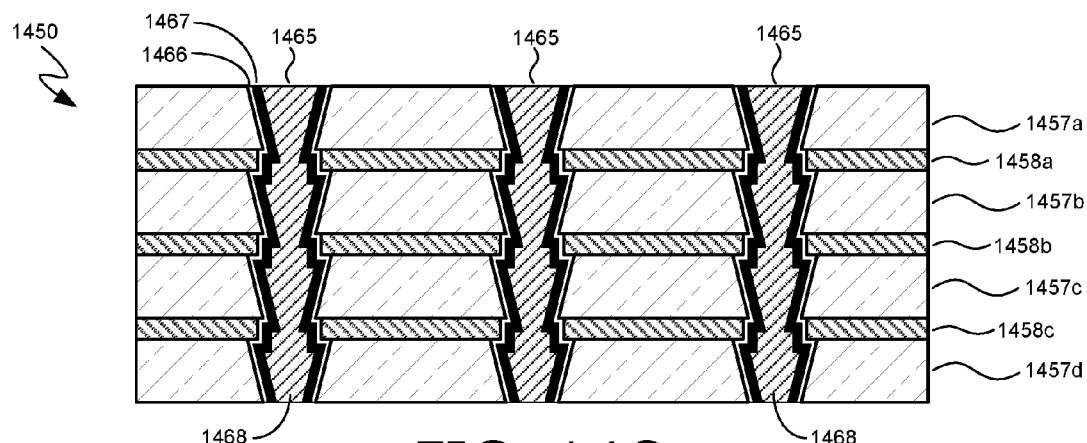

Referring next to block 1325, a dielectric material is disposed over the metal layer to fill the thru-holes. This is illustrated in FIG. 14C, where a dielectric material 1468 has been disposed over the metal layer 1467 to fill the interior void of each hole 1465. Dielectric material 1468 may comprise any suitable material, and in one embodiment the dielectric material 1468 comprises an organic material. Further, the dielectric material 1468 may be deposited using any suitable technique, such as screen printing, CVD, or PVD. Again, however, the metal layer 1467 may substantially fill the thru-holes 1465, in which case the dielectric material may be omitted. In a further embodiment, as shown in FIG. 14C, excess seed layer 1466 and excess metal layer 1467 may be removed from the first and second surfaces 1452, 1454 of the core 1450. The excess seed and metal layers may be removed from the surfaces 1452, 1454 by, for example, a grinding process, a chemical-mechanical polishing technique, or an etching process.

Figure 4C:
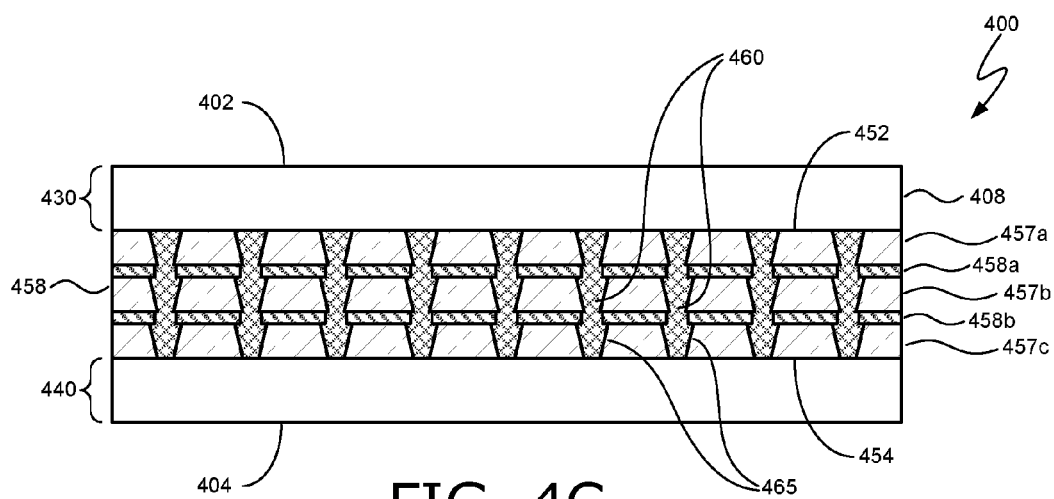

Returning now to FIG. 3, and block 330 in particular, one or more build-up layers is disposed on each side of the multi-layer glass core (or perhaps only one side) to create build-up structures, as previously described. This is shown in FIG. 4C, where a first build-up structure 430 has been formed on the first surface 452 of core 450, and a second build-up structure 440 has been formed on the core's second surface 454. Each build-up structure 430, 440 may comprise any suitable number of alternating layers of dielectric material and metal (e.g., one or more), and they may be formed by any suitable techniques. The structure and formation of such build-up structures is described in greater detail with reference to FIGS. 1B through 1G and the accompanying text above. In one embodiment, at least one of the conductors 460 is electrically coupled with a metal layer of the first build-up structure 430 that is nearest the core 450, and in a further embodiment at least one of the conductors 460 is electrically coupled with a metal layer of the second build-up structure 440 that is nearest the core. The combination of multi-layer glass core 450 and build-up structures 430, 440 may comprise a substrate 400 for an integrated circuit device.

With reference now to block 340 in FIG. 3, electrically conductive terminals may be formed on the substrate (terminals are not shown in FIGS. 4A-4C). A first set of terminals may be formed on the first build-up structure 430, and a second set of terminals may be formed on the second build-up structure 440. The structure and formation of such terminals is described in greater detail with reference to FIGS. 1A through 1G and the accompanying text above.

As noted above, in one embodiment, the multi-layer glass core 450, as well as first and second build-up structures 430, 440, includes structures and features corresponding to two or more substrates. In this embodiment, the core 450 (with build-up structures 430, 440) will be singulated into these discrete substrates (either before or after formation of the terminals).

Figure 5:
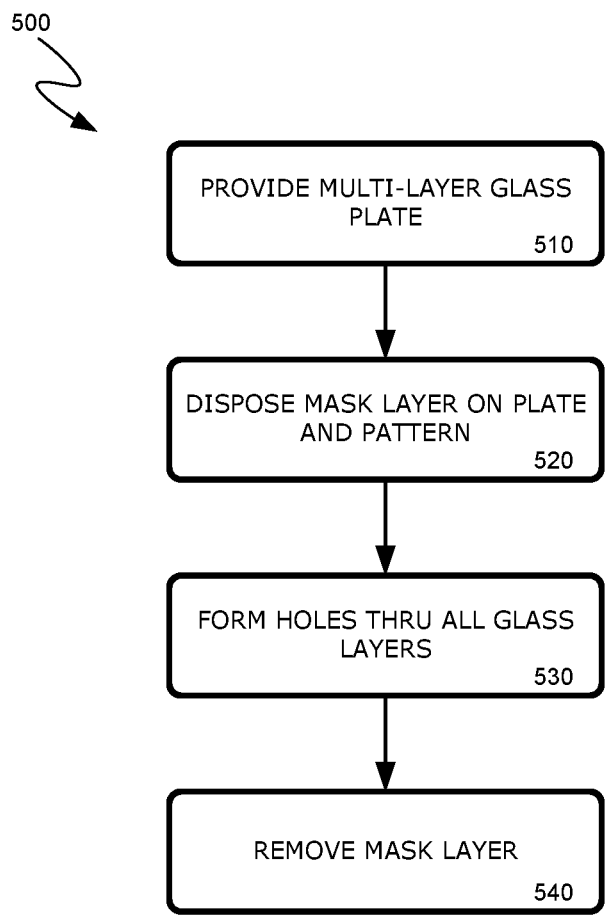
FIG. 5 is a block diagram illustrating an embodiment of a method of forming a multi-layer glass core.

Turning now to FIG. 5, illustrated is an embodiment of a method of forming a multi-layer glass core having one or more thru-holes. Embodiments of the method shown in FIG. 5 are further illustrated in the schematic diagrams of FIGS. 6A through 6C, and reference should be made to these figures as called out in the text below.

Figure 6A:
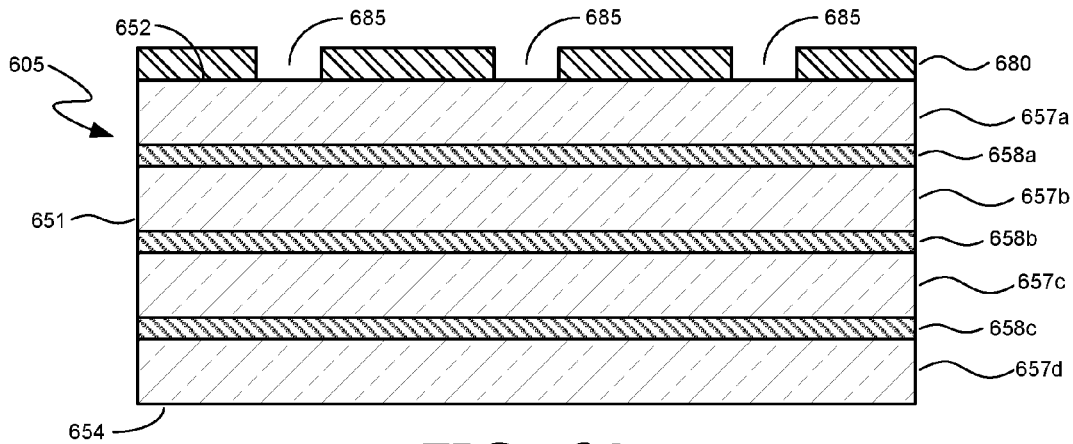
FIGS. 6A-6C are schematic diagrams illustrating embodiments of the method of FIG. 5.

Referring to block 510 in FIG. 5, a multi-layer glass plate is provided. This is illustrated in FIG. 6A, where a multi-layer glass plate 605 is shown. Plate 605 comprises a number of glass layers 657a, 657b, 657c, 657d attached together by bonding layers 658a, 658b, 658c (e.g., bonding layer 658a is coupled with glass layers 657a and 657b, and so on). Multi-layer glass plate 605 also includes a periphery 651 that extends between a first surface 652 and a second surfaces 654. According to one embodiment, the multi-layer glass plate 605 may have a thickness between 50 micrometers and 800 micrometers. In one embodiment, the multi-layer glass plate is of a size and configuration to enable formation of a single substrate core. In a further embodiment, the plate 605 is of a size and configuration to enable the formation of two or more substrate cores (e.g., plate 605 comprises a panel from which two or more substrate cores, or two or more substrates, will be cut).

Figure 6B:
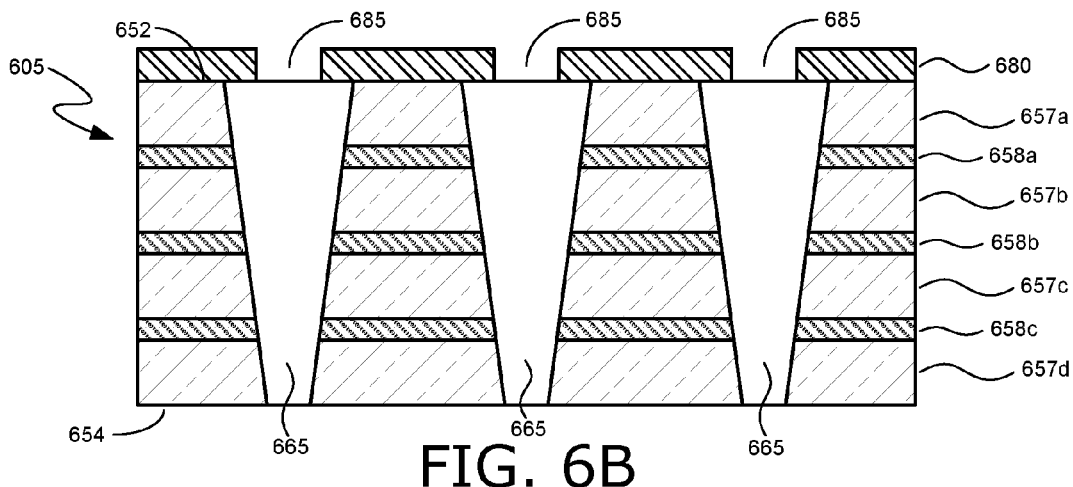
Figure 6C:
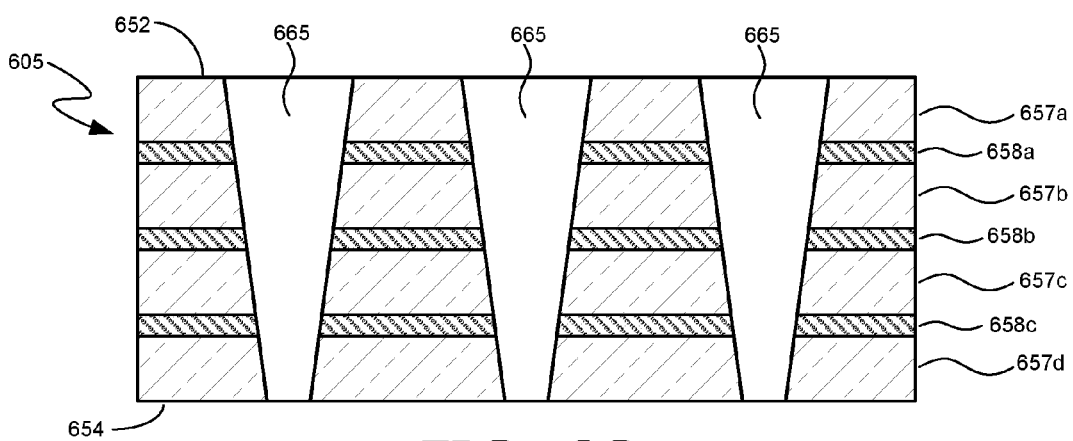

The individual glass layers 657a-d may comprise any suitable type of glass. In one embodiment, the glass layers 657a-d comprise the same glass material; however, in other embodiments any one of the glass layers 657a-d may comprise a glass material that is different than the glass material of any of the other glass layers. Although four glass layers are shown in FIGS. 6A through 6C, the plate 605 may comprise any suitable number of glass layers (e.g., two layers, three layers, five or more layers, etc.), depending upon the desired mechanical and electrical characteristics of the core (or cores) to be formed from plate 605. Glass layers 657a-d may have any suitable thickness, and in one embodiment each glass layer has a thickness of approximately 50 to 200 micrometers. Also, in one embodiment the glass layers 657a-d may all have the same thickness (as depicted in the figures), or alternatively any one of the glass layers 657a-d may have a thickness different than one or more of the other glass layers.

The bonding layers 658a-c may also have any suitable thickness, and in one embodiment each bonding layer has a thickness of approximately 20 to 100 micrometers. According to one embodiment, the bonding layers 658a-c all have the same thickness (as shown in the figures); however, in other embodiments any one of the bonding layers 658a-c may have a thickness different than one or more of the other bonding layers.

The discrete glass layers 657a, 657b, 657c, 657d may be bonded together by any suitable technique. In one embodiment, as shown in the figures, bonding layers 658a, 658b, 658c are disposed between the glass layers, and each of these layers is coupled with two adjacent glass layers (e.g., bonding layer 658a is coupled with glass layers 657a and 657b, and so on). According to one embodiment, each bonding layer 658a-c includes an adhesive, and in a further embodiment the bonding layers comprise an organic material. In one embodiment, each bonding layer 658a-c comprises a dry film adhesive material, such as a film comprised of an acrylic resin or an epoxy resin.

Various methods of coupling multiple glass layers together using adhesive bonding layers will now be described with respect to FIG. 15 and FIGS. 16A though 16E. First, however, it should be understood that the disclosed embodiments are not limited to adhesive bonding and, further, that the multi-layer glass plate 605 (and, hence, a core formed from this plate) may be created without adhesives. For example, as previously described, in other embodiments, multiple glass layers may be coupled together using direct oxide-to-oxide bonding, diffusion bonding (either with or without intermediate layers between adjacent glass layers), or these glass layers may be secured together mechanically (e.g., as by material deposited in thru-holes extending through the plate 605), as well as by any combination of these and/or other techniques.

Figure 15:
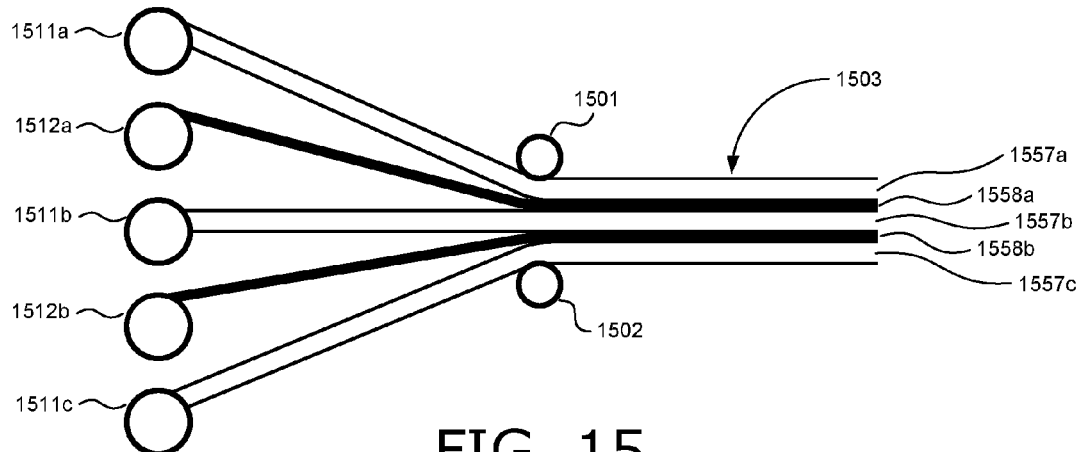
FIG. 15 is a schematic diagram illustrating an embodiment of a method of making a multi-layer glass plate.

Turning to FIG. 15, in one embodiment, a multi-layer glass plate is formed using a roller lamination process. In the embodiment of FIG. 15, a first source of glass sheet 1511a, a first source of adhesive film 1512a, a second source glass sheet 1511b, a second source of adhesive film 1512b, and a third source of glass sheet 1511c are compressed together between rollers 1501 and 1502 in a continuous manner to form a multi-layer glass laminate 1503. Multi-layer glass laminate comprises discrete glass layers 1557a, 1557b, and 1557c coupled together by adhesive layers 1558a and 1558b, as shown. Any suitable number of glass sheets may be joined together by adhesive layers to form the glass laminate 1503. The glass laminate 1503 may then be cut to any suitable lengths to form one or more multi-layer glass plates (e.g., a plate 605 having four glass layers coupled together by three adhesive layers, etc.).

Figure 16A:
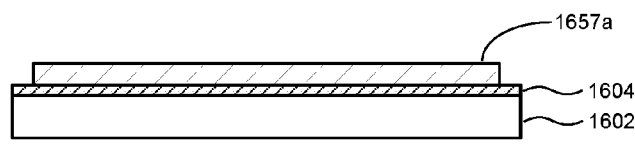
FIGS. 16A-16E are schematic diagrams illustrating another embodiment of a method of making a multi-layer glass plate.
Figure 16B:
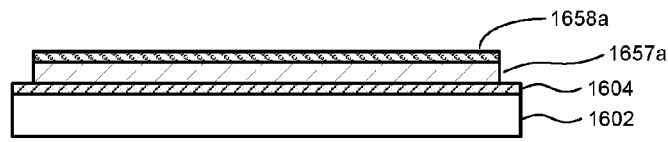
Figure 16C:
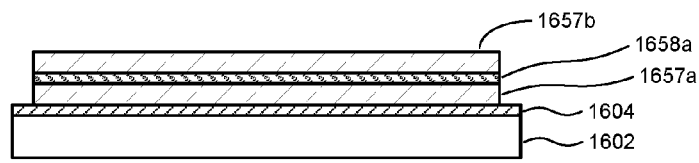
Figure 16D:
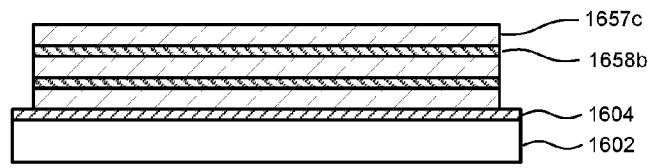
Figure 16E:

With reference now to FIGS. 16A through 16E, in another embodiment, a multi-layer glass plate is formed by lamination on a removable carrier. As shown in FIG. 16A, a first glass layer 1657a is adhered to a removable carrier 1602 by a releasable adhesive 1604. In one embodiment, the releasable adhesive 1604 comprises an adhesive material that degrades under exposure to ultra violet (UV) light. In another embodiment, the releasable adhesive 1604 comprises an adhesive material that degrades under exposure to a solvent. As shown in FIG. 16B, a first adhesive layer 1658a is disposed over glass layer 1657a. In one embodiment, the adhesive layer 1658a comprises a dry film adhesive, and in another embodiment the adhesive layer 1658a comprises a liquid adhesive that is sprayed or printed on the glass layer 1657a and then cured. Referring to FIG. 16C, a second glass layer 1657b is then disposed on the first adhesive layer 1658a, and the aforementioned processes are repeated. For example, as shown in FIG. 16D, a second adhesive layer 1658b (applied as either a dry film or a liquid) is disposed over glass layer 1657b, and a third glass layer 1657c is disposed over this second adhesive layer. As shown in FIG. 16E, the carrier 1602 is released by degradation of the releasable adhesive 1604 (e.g., by application of UV light, by application of a solvent, etc.), leaving a free-standing multi-layer glass plate 1605.

Returning now to FIG. 5, a mask layer is disposed on the multi-layer glass plate and patterned, as set forth in block 520. This is also illustrated in FIG. 6A, where a mask layer 680 has been disposed over the first surface 652 of plate 605. Further, the mask layer 680 is patterned to form openings 685. Mask layer 680 may comprise any material capable of adhering to the glass material of layer 657a, and that is also amendable to patterning. For example, the mask layer 680 may comprise a photoresist material which can be patterned by photolithography and etching techniques. In addition, the mask layer 680 comprises a material that can withstand subsequent removal of portions of the glass layers and bonding layers (e.g., wet etching processes).

As set forth in block 530, holes are formed through all the glass layers, as well as the bonding layers. This is illustrated in FIG. 6B, where thru-holes 665 have been formed at locations corresponding to openings 685 in mask layer 680. The holes 665 extend through all glass layers 657a-d and all of the bonding layers 658a-c. However, in other embodiments, one or more of the holes 665 may extend through only a portion of the plate's thickness. According to one embodiment, the vias 665 are formed by a wet etching process (or processes) utilizing an etch chemistry (or chemistries) that will remove the glass and bonding layers. For example, an etchant that can remove glass may comprise a solution including hydrofluoric acid (HF), or alternatively an oxide etch or buffered oxide etch may be employed. An etchant that can remove the material of bonding layers 658a-c may comprise a solution including an appropriate solvent. In another embodiment, the vias 665 may be formed by a dry etching process (e.g., an etchant comprising fluorocarbon gas to remove the glass and an etchant comprising oxygen and/or hydrogen to remove the bonding layers). After formation of thru-holes 665, the mask layer 680 may be removed from the multi-layer glass plate, as set forth in block 540 and as shown in FIG. 6C.

In the embodiment of FIG. 5 (as well as the embodiments of FIGS. 7, 9, and 11, respectively), an etching process (or processes) is utilized to form vias in the various glass and bonding layer materials. However, it should be noted that the disclosed embodiments are not limited to hole formation by etching and, further, that other processes may be used to form thru-holes in a multi-layer core and/or to form vias in any individual glass or bonding layer. For example, a via may be formed in a glass layer by an imprinting process while the glass has been elevated to the softening temperature. By way of further example, a via may be formed in a glass or bonding layer by sand blasting.

Figure 7:
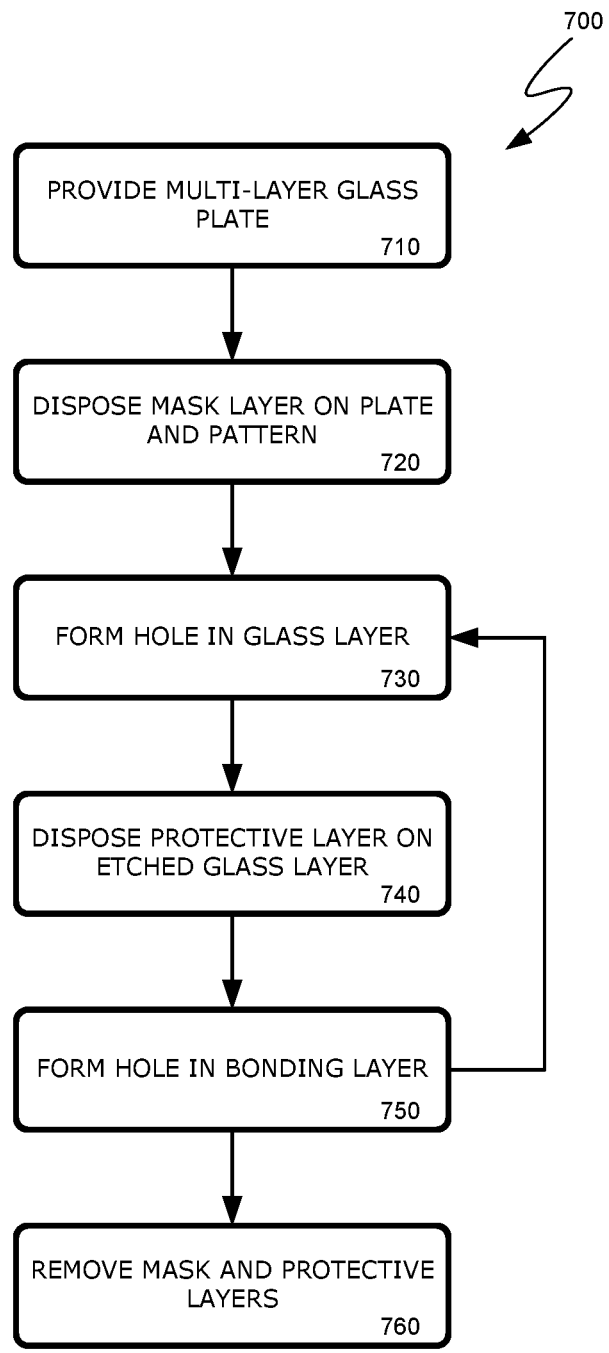
FIG. 7 is a block diagram illustrating another embodiment of a method of forming a multi-layer glass core.

With reference next to FIG. 7, illustrated is another embodiment of a method of making a multi-layer glass core having one or more thru-holes. Embodiments of the method shown in FIG. 7 are further illustrated in the schematic diagrams of FIGS. 8A through 8J, and reference should be made to these figures as called out in the following below.

Figure 8A:
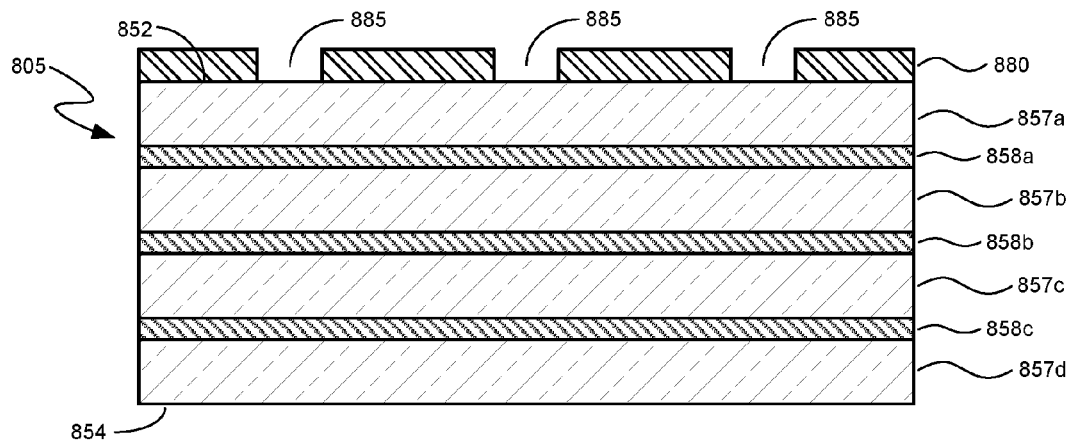
FIGS. 8A-8J are schematic diagrams illustrating embodiments of the method of FIG. 7.

Referring to block 710 in FIG. 7, a multi-layer glass plate is provided. This is illustrated in FIG. 8A, which shows a multi-layer glass plate 805 having a first surface 852 and an opposing second surface 854. Plate 805 includes separate glass layers 857a, 857b, 857c, and 857d coupled together by bonding layers 858a, 858b, and 858c. Multi-layer glass plate 805 may be similar to multi-layer glass plate 605 (see FIGS. 6A, 15, and 16, as well as the accompanying text above).

As set forth in block 720, a mask layer is disposed on the multi-layer glass plate and is patterned. This is also illustrated in FIG. 8A, where a mask layer 880 has been disposed over the first surface 852 of plate 805. In addition, the mask layer 880 is patterned to form openings 885. Mask layer 880 may comprise any material capable of adhering to the glass material of layer 857a, and that is also amendable to patterning. By way of example, the mask layer 880 may comprise a photoresist material which can be patterned by photolithography and etching techniques. In addition, the mask layer 880 comprises a material that can withstand subsequent removal of portions of the glass layers and bonding layers (e.g., wet etching processes).

Figure 8B:
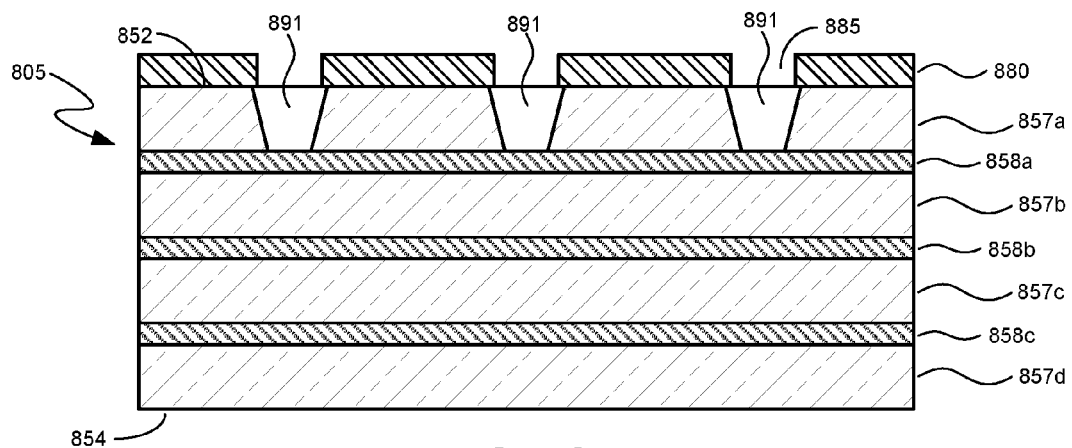

As set forth in block 730, a hole or via is formed in one of the glass layers. This is illustrated in FIG. 8B, where vias 891 have been formed in the glass layer 857a at locations corresponding to openings 885 in mask layer 880. According to one embodiment, the vias 891 are formed by a wet etching process utilizing an etch chemistry that will remove the glass layer 857a. In another embodiment, a dry etching process may be utilized to form a via in glass. Examples of suitable etchants for glass are described above.

Figure 8C:
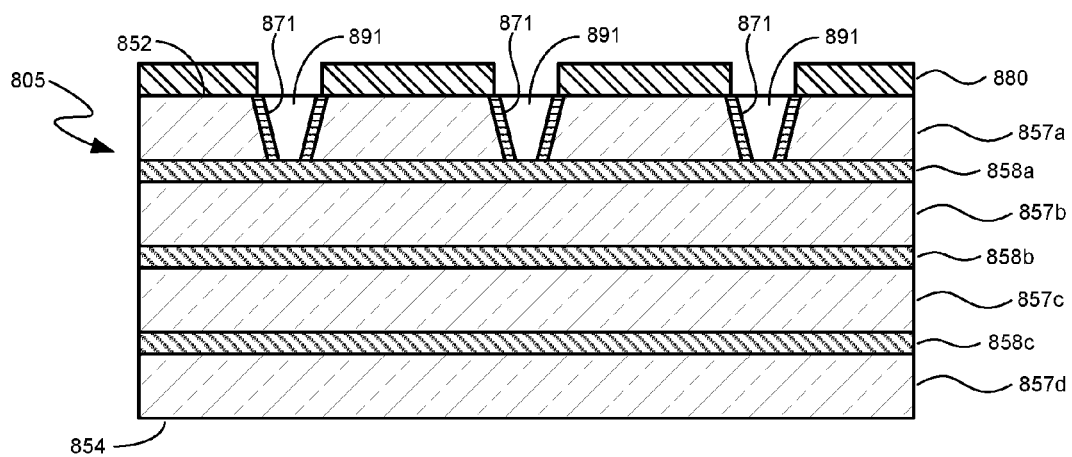

As set forth in block 740, a protective layer is disposed on the glass layer in which the hole was previously formed. This is illustrated in FIG. 8C, where a protective layer 871 has been disposed over the walls of the vias 891 formed in glass layer 857a. Additional vias will be formed in the bonding layers and other glass layers to form thru-holes in the plate 605, and the function of the protective layer 871 is to prevent or substantially inhibit removal of the material of glass layer 857a during the formation of these other vias (e.g., during subsequent etching processes on the bonding layers and other glass layers). The protective layer 871 may comprise any material capable of withstanding the aforementioned subsequent via formation processes, such as, for example, an organic material (e.g., benzocyclobutene, polytetrafluoroethylene, polyimide, etc.), a metal (e.g., platinum or gold), a metal oxide, or silicon nitride. Further, the protective layer 871 may be deposited over the walls of hole 891 using any suitable technique, such as atomic layer deposition (ALD) or CVD. In one embodiment, the protective layer 871 is deposited by a process that is selective to glass. In another embodiment, a non-selective blanket deposition process is used to deposit the protective material, and subsequently an anisotropic process is utilized to remove the protective material from the via bottoms.

Figure 8D:
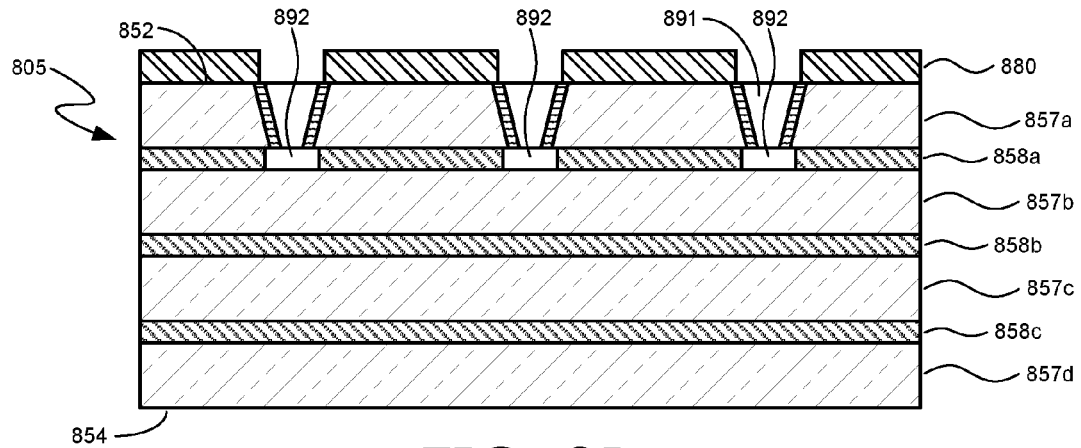

As set forth in block 750, a hole or via is formed in one of the bonding layers. This is illustrated in FIG. 8D, where vias 892 have been formed in the bonding layer 858*a* at locations corresponding to openings 885 in mask layer 880. Each of the holes 892 is generally aligned relative to the overlying hole 891 in glass layer 857*a* (e.g., the centerlines of holes 891 and 892 are approximately coincident). According to one embodiment, the vias 892 are formed by a wet etching process, and in another embodiment the vias 892 may be formed using a dry etching process. Examples of suitable etchants for the bonding layer material are described above.

Figure 8E:
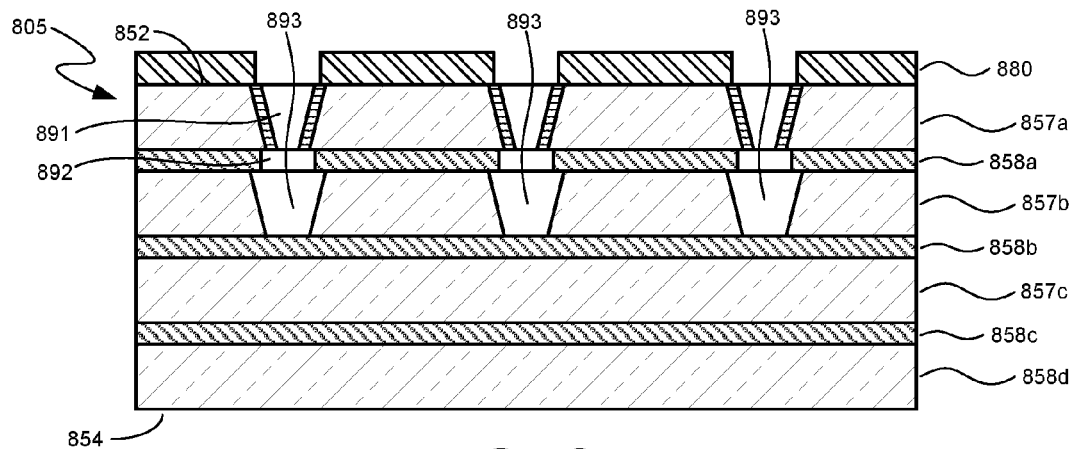
Figure 8F:
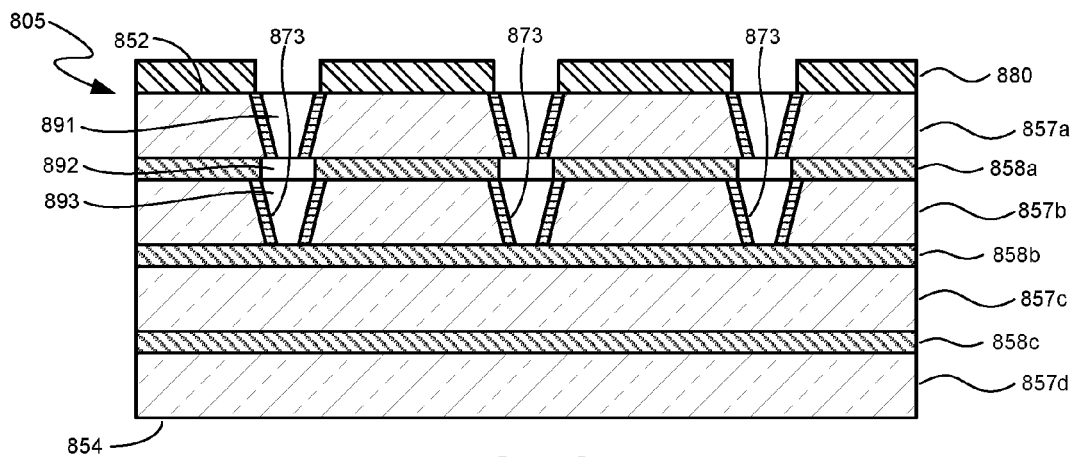
Figure 8G:
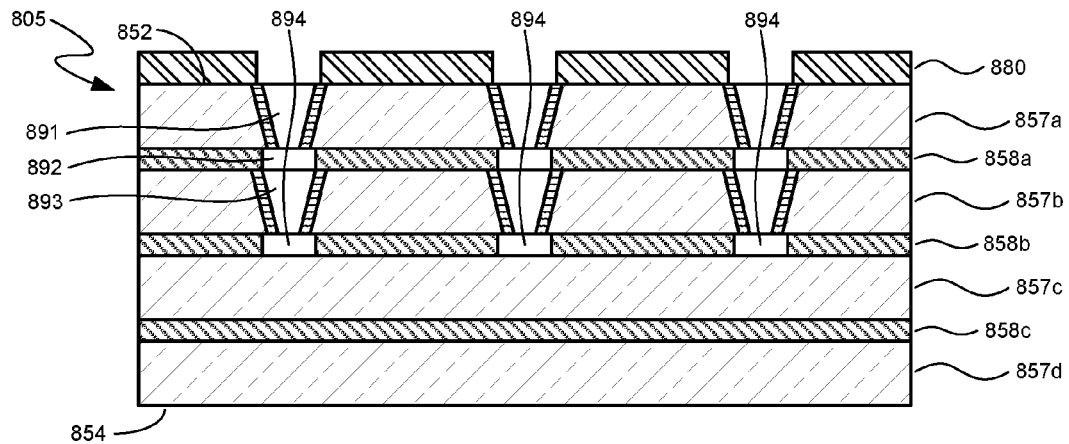

As shown in FIG. 7, the previously described steps are repeated, as needed, to form holes through the multi-layer glass plate. Thus, referring again to block 730, a hole is formed in the next glass layer. This is illustrated in FIG. 8E, where holes 893 have been formed in glass layer 857*b*. Holes 893 may be formed as described above, and these holes are generally aligned with the previously formed vias 891 and 892 (e.g., the centerlines of holes 891, 892, 893 are approximately coincident). As set forth in block 740, a protective layer is disposed on the glass layer in which the holes were formed. This is illustrated in FIG. 8F, where a protective layer 873 has been disposed over walls of the previously formed holes 893 in glass layer 857*b*. Protective layer 873 is similar to the protective layer 871, as described above. Referring to block 750, a hole or via is then formed in the next bonding layer. This is illustrated in FIG. 8G, where holes 894 have been formed in the bonding layer 858*b*, wherein the holes 894 are generally aligned with previously formed vias 891 through 893.

Figure 8H:
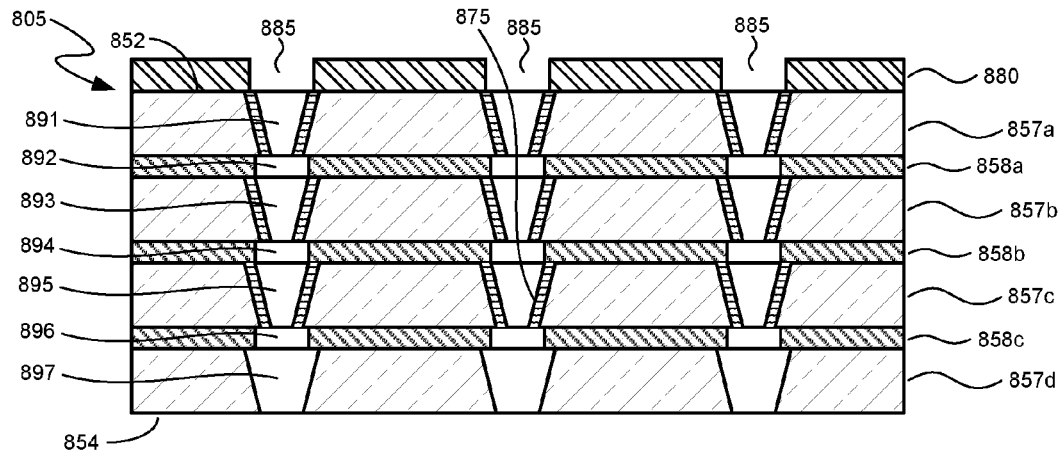

The hole formation processes described above with respect to block 730, 740, and 750 may be repeated, as needed, to form holes extending through the multi-layer glass plate 805. This is illustrated in FIG. 8H, where holes 895 have been formed in glass layer 857*c*, holes 896 have been formed in bonding layers 858*c*, and holes 897 have been formed in glass layer 858*d*. Note that a protective layer 875 was deposited over walls of the holes 895 in glass layer 857*c*, the protective layer 875 being similar to the previously describe protective layer 871. All of the holes 891 through 897 have been formed at locations corresponding to openings 885 in mask layer 880, and these holes are generally aligned relative to each other (e.g., the centerlines of holes 891 through 897 are approximately coincident).

Figure 8I:
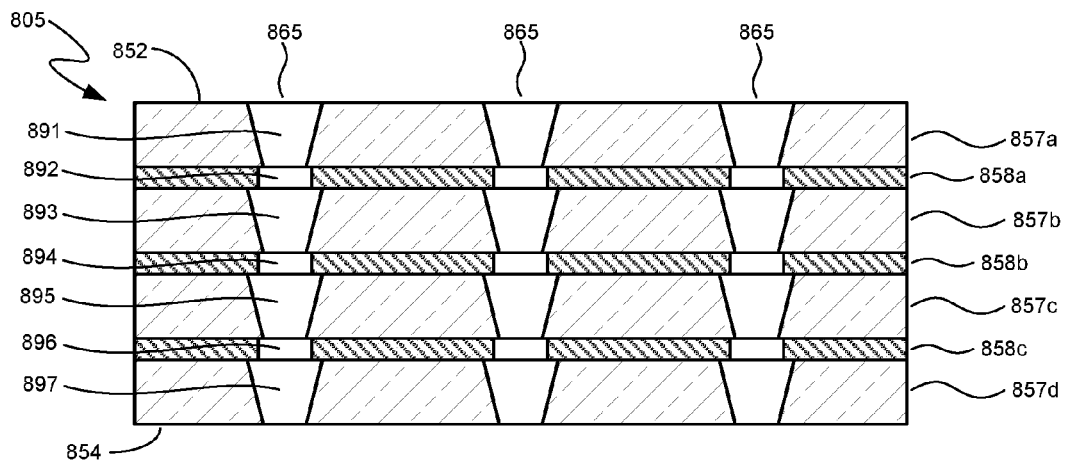

When hole formation is complete, the mask layer and protective layers are removed, as set forth in block 760. This is illustrated in FIG. 8I, where mask layer 880 and protective layers 871, 873, and 875 have been removed. A number of holes 865 now extend through the multi-layer glass plate 805 from the plate's first surface 852 to the second opposing surface 854. Each thru-hole 865 comprises a series of holes 891, 892, 893, 894, 895, 896, and 897 formed in the glass layers 857*a*-*d* and bonding layers 858*a*-*c*. The aspect ratio of a hole or via can be defined as the via's length (or depth) divided by a maximum diameter of the via. One advantage of the process described in FIGS. 7 and 8A-8I is that thru-holes in the plate 805 having a large aspect ratio can be obtained. For example, in one embodiment, the thru-holes 865 in multi-layer glass plate 805 may have an aspect ratio in a range of approximately 2 to 6.

Figure 8J:
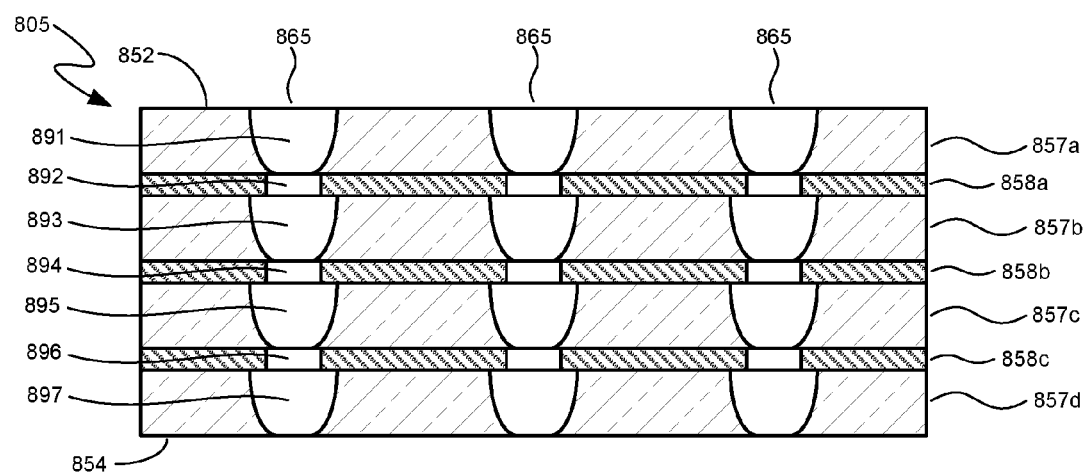

In the embodiments of FIGS. 8A-8I, each of the vias 891, 893, 895, and 897 has a cross-sectional profile that is a generally straight taper through the thickness of their respective glass layer 857*a*, 857*b*, 857*c*, and 857*d*. However, as noted above, the shape of a via formed in a glass layer (or bonding layer) may vary depending upon the fabrication technique (e.g., wet etching, dry etching, laser drilling, etc.), as well as the process characteristics. In other embodiments, for example, a via formed in one of the glass layers 857*a*-*d* (or one of the bonding layers 858*a*-*c*) may have a curved shape. By way of example, as shown in FIG. 8J, the vias 891, 893, 895, and 897 may have cross-sectional profiles that are scalloped shaped. Any of the disclosed embodiments may incorporate such a scalloped shaped via. Further, the disclosed embodiments are not limited to such a scallop shape, and it should be understood that a via may have any suitable shape or profile.

Figure 9:
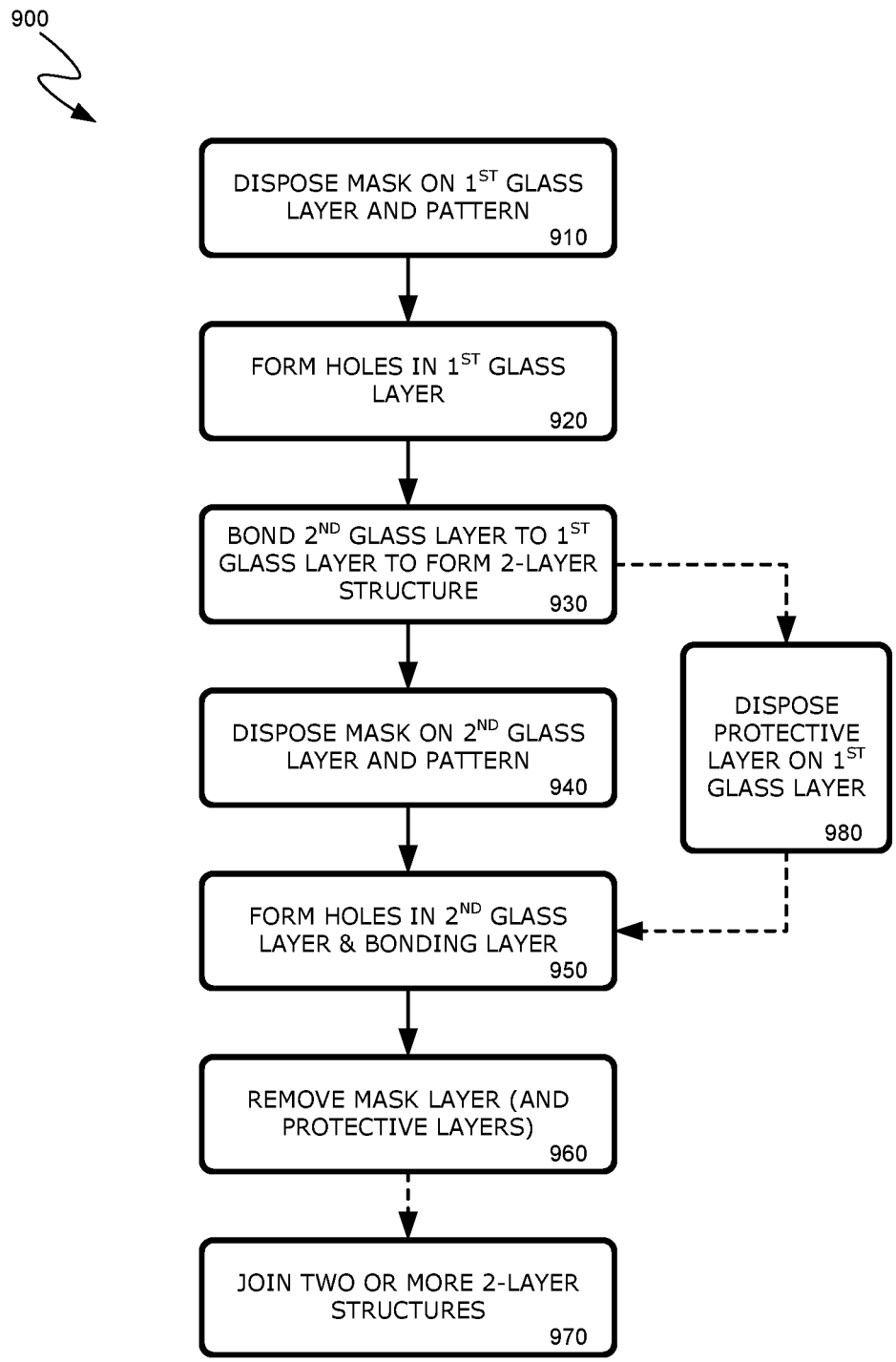
FIG. 9 is a block diagram illustrating a further embodiment of a method of forming a multi-layer glass core.

Turning next to FIG. 9, illustrated is a further embodiment of a method of making a multi-layer glass core having one or more thru-holes. Embodiments of the method shown in FIG. 9 are further illustrated in the schematic diagrams of FIGS. 10A through 10H, and reference should be made to these figures as called out in the text below.

Figure 10A:
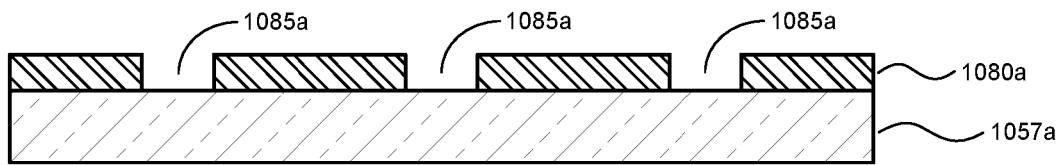
FIGS. 10A-10H are schematic diagrams illustrating embodiments of the method of FIG. 9.
Figure 10B:
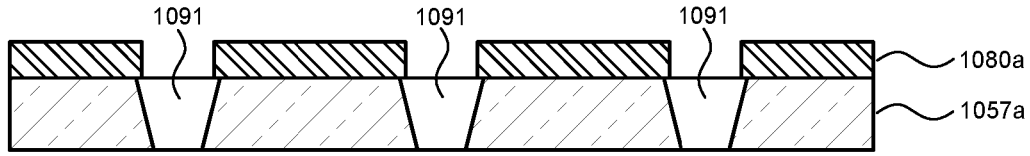
Figure 10C:
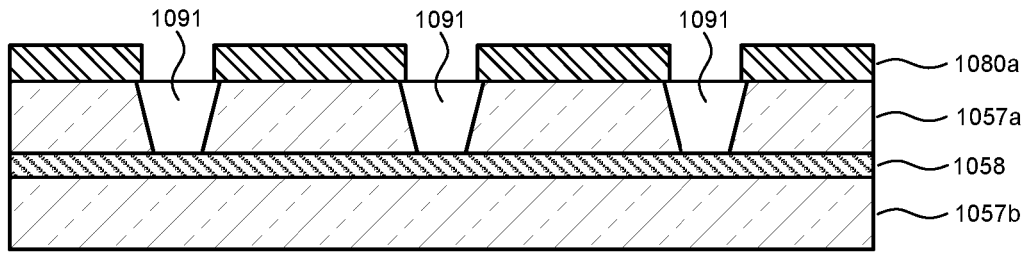
Figure 10D:
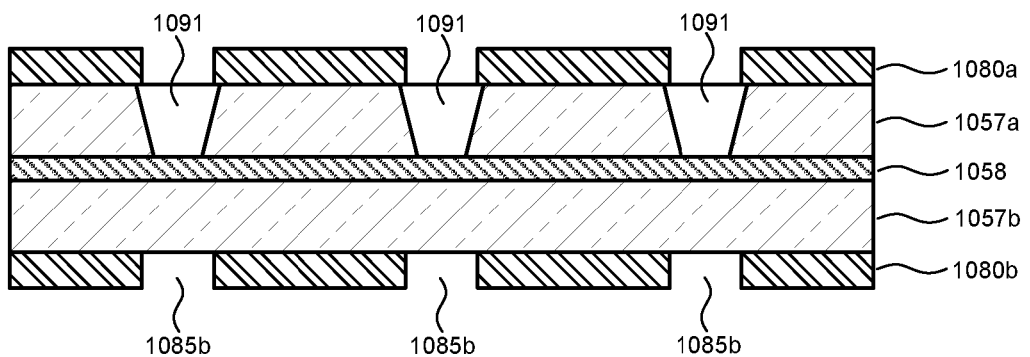
Figure 10E:
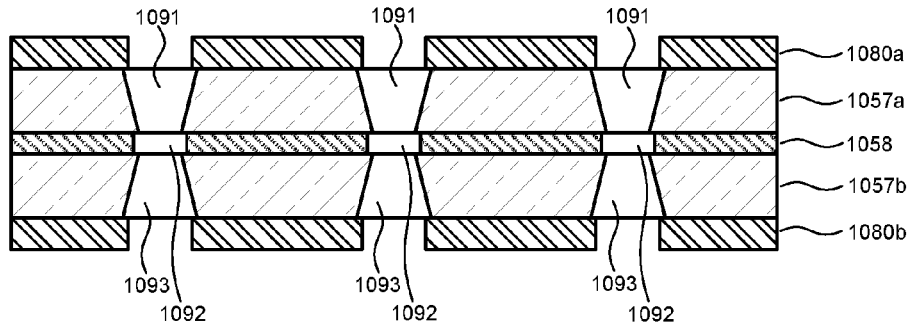
Figure 10F:
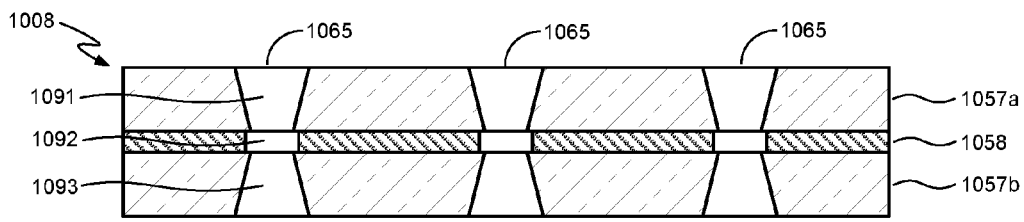
Figure 10G:
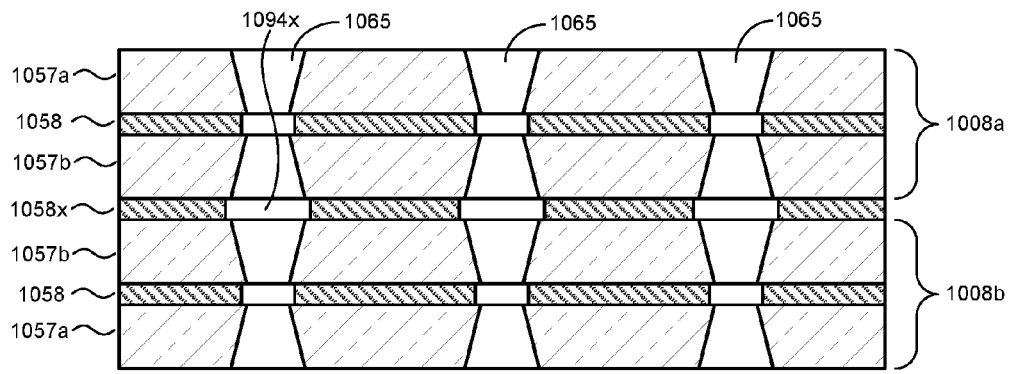

Referring to block 910 in FIG. 9, a mask layer is disposed on a first glass layer and is patterned. This is illustrated in FIG. 10A, where a mask layer 1080*a* has been disposed on a glass layer 1057*a*. The mask layer 1080*a* has been patterned to form openings 1085*a*. As set forth in block 920, holes are formed in the first glass layer. This is illustrated in FIG. 10B, where holes 1091 have been formed in the glass layer 1057*a* at locations corresponding to openings 1085*a* in mask layer 1080*a*. As set forth in block 930 of FIG. 9, a second glass layer it bonded to the first glass layer to form a two-layer structure. This is illustrated in FIG. 10C, where a second glass layer 1057*b* has been coupled with glass layer 1057*a* by bonding layer 1058. Referring to block 940, a mask layer is disposed on the second glass layer and patterned. This is illustrated in FIG. 10D, where mask layer 1080*b* has been disposed on glass layer 1057*b* and patterned to form openings 1085*b*. Holes are then formed in the second glass layer and bonding layer, as set forth in block 950. This is illustrated in FIG. 10E, where holes 1093 have been formed in glass layer 1057*b* and holes 1092 have been formed in bonding layer 1058. The holes 1091, 1092, 1093 are generally aligned (e.g., the centerlines of these holes are approximately coincident). As set forth in block 960, the mask layers are removed. This is illustrated in FIG. 10F, where mask layers 1080*a*, 1080*b* have been removed, leaving a two-layer structure 1008 having thru-holes 1065, each thru-hole 1065 comprising a series of aligned holes 1091, 1092, 1093. The holes 1091, 1092, 1093 may be formed by any of the techniques previously described and, further, the glass layers 1057*a*, 1057*b* may be jointed together by any of the aforementioned methods.

The two-layer structure 1008 of FIG. 10F may be used as a multi-layer glass core in a substrate (e.g., as core 150, or as core 450). Alternatively, the two-layer structure 1008 may comprise a panel from which multiple substrates may be formed. However, in another embodiment (see block 970), two or more of these two-layer structures may be bonded together to form a multi-layer glass core (or a panel from which multiple substrates can be formed). This is illustrated, by way of example, in FIG. 10G, where a first two-layer structure 1008*a* is coupled with a second two-layer structure 1008*b*. Each two-layer structure includes a first glass layer 1057*a* coupled with a second glass layer 1057*b* by a bonding layer 1058, as described above. An additional bonding layer 1058*x* couples the first and second two-layer structures 1008*a*, 1008*b* to form a multi-layer glass core 1005 having thru-vias 1065. Each thru-via 1065 include a hole 1094*x* formed in the bonding layer 1058*x*. In one embodiment, the holes 1094*x* in bonding layer 1058*x* are pre-formed prior to bonding of the two-layer structures 1008*a*, 1008*b*, and in another embodiment the holes 1094*x* are formed after bonding of these two-layer structures (e.g., as by etching or other suitable process).

Figure 10H:
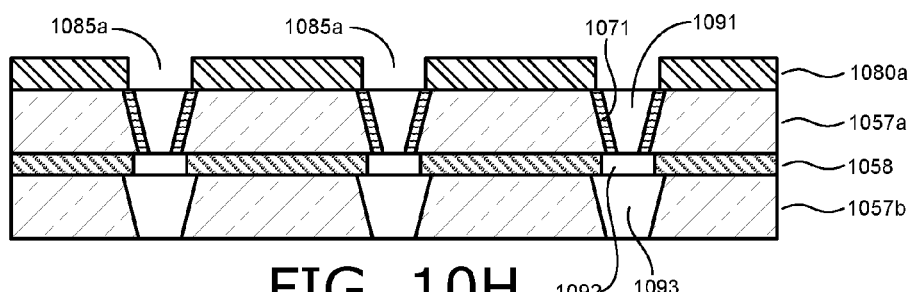

In an alternative embodiment, as set forth in block 980, a protective layer is disposed on the first glass layer (and the second mask layer 1080*b* may be omitted). This is illustrated in FIG. 10H, where a protective layer 1071 is deposited over a wall of the vias 1091 formed in first glass layer 1057*a*. Holes 1092 and 1093 in bonding and glass layers 1058, 1057*b*, respectively, may then be formed using mask layer 1080*a* and the openings 1085*a* of this layer. Protective layer 1071 may be similar to protective layer 871 described above. After formation of holes 892, 893, the protective layer 1071 is removed, as is mask layer 1080*a* (see block 960). The two-layer structure of FIG. 10H may be used as a multi-layer glass core (e.g., as core 150, or as core 450), or this two-layer structure may be coupled with two or more additional two-layer structures (e.g., see FIG. 10G).

Figure 11:
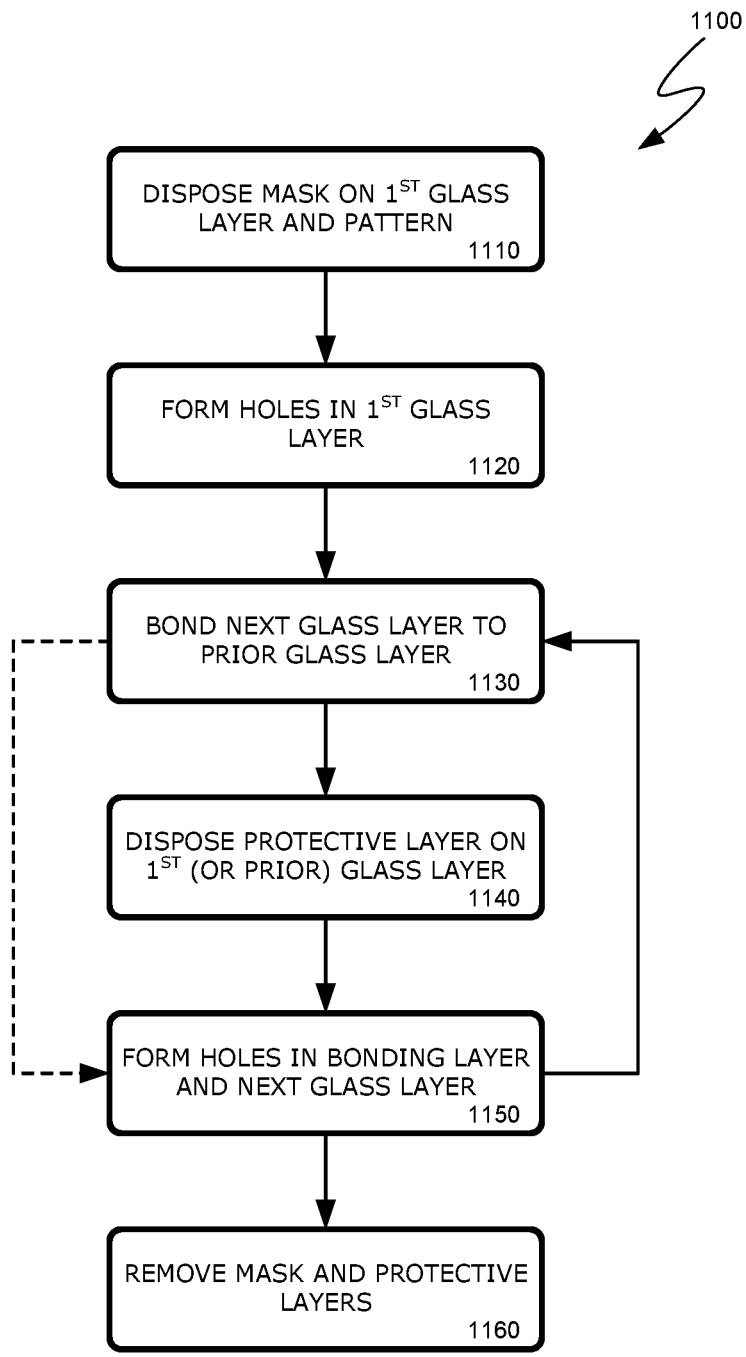
FIG. 11 is a block diagram illustrating yet another embodiment of a method of forming a multi-layer glass core.

With reference now to FIG. 11, illustrated is yet another embodiment of a method of forming a multi-layer glass core having one or more thru-holes. Embodiments of the method shown in FIG. 11 are further illustrated in the schematic diagrams of FIGS. 12A through 12E, and reference should be made to these figures as called out in the following text.

Figure 12A:
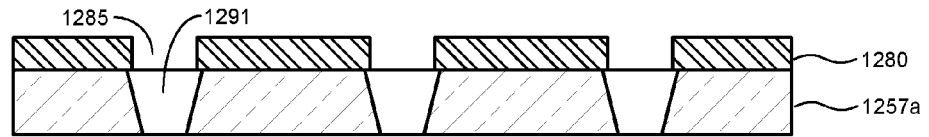
FIGS. 12A-12E are schematic diagrams illustrating embodiments of the method of FIG. 11.
Figure 12B:
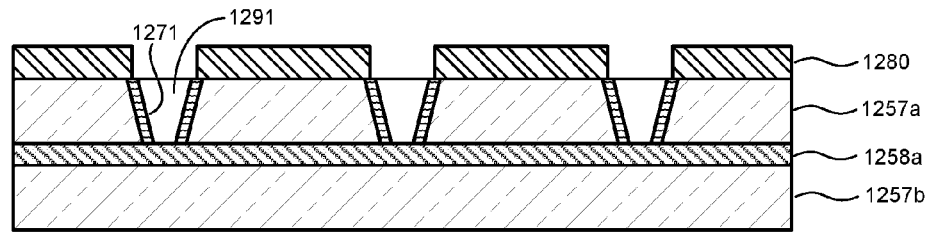
Figure 12C:
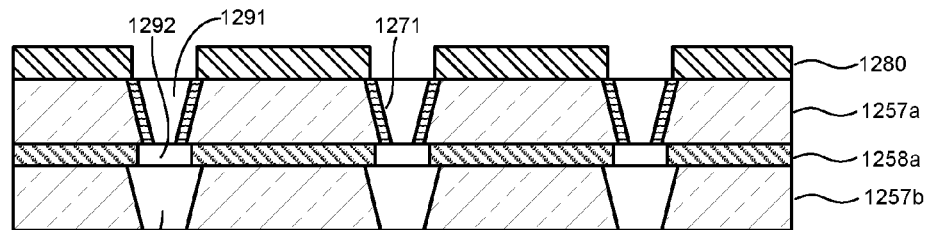

Referring to block 1110 in FIG. 11, a mask layer is disposed on a first glass layer and patterned. This is illustrated in FIG. 12A, where a mask layer 1280 has been disposed on a glass layer 1257*a*, and the mask layer 1280 has been patterned to form openings 1285. As set forth in block 1120, holes are formed in the first glass layer. This is also shown in FIG. 12A, where holes 1291 have been formed in the glass layer 1257*a* at locations corresponding to openings 1285 of mask layer 1280. As set forth in block 1130 of FIG. 11, another glass layer is bonded to the first (or prior) glass layer. This is illustrated in FIG. 12B, where a second glass layer 1257*b* has been coupled with glass layer 1257*a* by a first bonding layer 1058*a*. Referring to block 1240, a protective layer is disposed on the first (or prior) glass layer. This is also illustrated in FIG. 12B, where a protective layer 1271 has been disposed over walls of holes 1291 formed in the first glass layer 1257*a*. Protective layer 1271 may be similar to the previously described protective layer 871. Holes are then formed in the bonding layer and next glass layer, as set forth in block 1150. This is illustrated in FIG. 12C, where holes 1292 have been formed in bonding layer 1258*a* and holes 1293 have been formed in second glass layer 1257*b*.

Figure 12D:
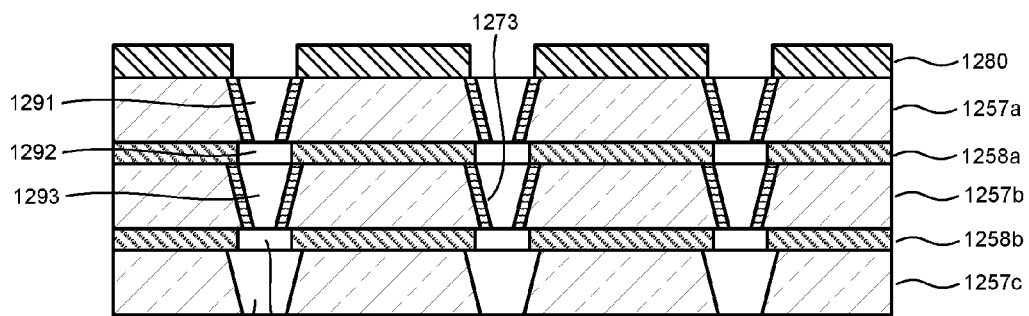

The process described above with respect to blocks 1130, 1140, and 1150 may then be repeated, as needed, to form a multi-layer glass core having any desired number of glass layers. For example, as shown in FIG. 12D, an additional glass layer 1257*c* has been bonded to second glass layer 1257*b* by a second bonding layer 1258*b*, and holes 1294 have been formed in the bonding layer 1258*b* and holes 1295 have been formed in the glass layer 1257*c*. Note that a protective layer 1273 was disposed over walls of holes 1293 in second glass layer 1257*b* (see block 1140) prior to formation of holes 1295 in glass layer 1257*c*.

Figure 12E:
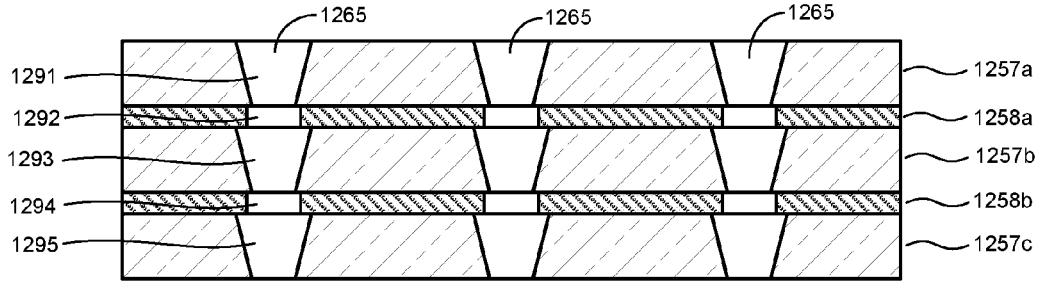

As set forth in block 1160, once the desired number of glass layers has been achieved, the mask layer and protective layers can be removed. This is illustrated in FIG. 12E, where mask layer 1280 and protective layers 1271 and 1273 have been removed. A multi-layer glass core 1205 having thru-holes 1265 remains. Each thru-hole comprises a series of holes 1291, 1292, 1293, 1294, and 1295 that are generally aligned (e.g., the centerlines of these holes are approximately coincident). The holes 1291, 1292, 1293, 1294, 1295 may be formed by any of the techniques previously described and, further, the glass layers 1257*a-c* may be joined together by any of the aforementioned methods. In an alternative embodiment, the multi-layer glass structure 1205 comprises a panel from which multiple substrates may be formed. According to another embodiment, protective layers on the glass may be omitted (see dashed line on the left-hand side of FIG. 11).

At this juncture, it should be noted that the figures are schematic diagrams provided as an aide to understanding the disclosed embodiments, and no unnecessary limitations should be implied from the figures. In some instances, a relatively small number of features may have been illustrated for clarity and ease of illustration. For example, the number of conductors 160, 460 (or holes 665, 865, 1065, 1265, 1465) extending through a multi-layer glass core (or multi-layer glass plate) shown in the figures may be substantially less than a number of conductors (or thru-vias) that may, in practice, be disposed in such a substrate core. Also, the figures may not be drawn to scale, and in some cases lines (e.g., hidden lines) have been omitted for ease of understanding.

Glass materials may have a CTE of approximately 3.2 ppm, although the CTE value is temperature dependent and will also vary depending upon the composition of any particular glass material. Silicon may have a CTE of approximately 2.6 ppm, which again is temperature dependent. Organic polymer-based materials typically used in the construction of package substrates and circuit boards may have a CTE of approximately 12 or more (again, a value that is temperature and composition dependent). Although, as noted above, the CTE of a substance is temperature and composition dependent, the CTE mismatch between a silicon die and the underlying substrate is significantly reduced using a multi-layer glass core substrate as compared to a polymer-based substrate material. In addition, glass may have a modulus, E, of approximately 75 GPA, whereas commonly used organic polymer-based materials may have a modulus of approximately 25 GPa (the value of E also being dependent upon the composition of a substance). Thus, a multi-layer glass core substrate may provide a three-fold increase in modulus, which in some embodiments may provide the potential for a corresponding three-fold decrease in substrate warpage. A further advantage of glass is that it may be manufactured with more consistent flatness than common polymer materials.

The above-described reductions in CTE mismatch and warpage may enable the use of a smaller pitch for die-to-package interconnects, as well as a larger number of these interconnects, providing increase I/O capability. For example, in one embodiment, a pitch of 50 micrometers or less may be achieved for die-to-package interconnects when using a multi-layer glass core substrate. Large substrate warpage may lead to non-contact-open failures in the die-to-package interconnects during the chip attach process, as well as leading to high stresses within the die itself (e.g., within the inter-layer dielectric layers, or ILD layers, of the die), both of which can result in lower reliability. Thus, the disclosed multi-layer glass core substrate may enable the implementation of higher I/O packages while, at the same time, maintaining or improving reliability.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
   providing a plate including a number of solid glass layers bonded together, the plate having a first surface and an opposing second surface;
   forming a first via in a first solid glass layer of the number of solid glass layers;
   disposing a protective layer on a wall of the first via; and
   forming a second via in a second solid glass layer adjacent the first solid glass layer, the first via generally aligned with the second via, the first and second vias forming at least part of a hole extending from the first surface to the second surface.

2. The method of claim 1, further comprising removing the protective layer.

3. The method of claim 2, further comprising:
   depositing a seed layer over a wall of the hole; and
   plating a metal over the seed layer to provide a conductor within the hole.

4. The method of claim 3, further comprising disposing a dielectric material in the hole over the metal plating.

5. The method of claim 3, further comprising
   disposing at least one dielectric layer and at least one metal layer at the first surface of the plate and electrically coupling the at least one metal layer at the first surface with the conductor; and
   disposing at least one dielectric layer and a least one metal layer at the second surface of the plate and electrically coupling the at least one metal layer at the second surface with the conductor.

6. The method of claim 5, further comprising:
   disposing a first set of terminals at the first side of the plate, the first set of terminals to mate with a corresponding array of terminals on an integrated circuit (IC) die; and
   disposing a second set of terminals at the second side of the plate, the second set of terminals to mate with a corresponding array of terminals on a next-level component.

7. The method of claim 5, wherein the at least one metal layer disposed at the first surface of the plate is disposed directly adjacent the first surface, and wherein the at least one metal layer disposed at the second surface of the plate is disposed directly adjacent the second surface.

8. The method of claim 1, wherein the first solid glass layer is coupled with the second solid glass layer by a bonding layer, the method further comprising forming a via in the bonding layer, the via of the bonding layer forming part of the hole.

9. The method of claim 1, wherein disposing the protective layer on the wall of the first via comprises disposing a material selected from the group consisting of an organic material, a metal, a metal oxide, and silicon nitride.

10. The method of claim 1, wherein disposing the protective layer on the wall of the first via comprises disposing the protective layer on the wall of the first via by atomic layer deposition.

11. The method of claim 1, wherein disposing the protective layer on the wall of the first via comprises disposing the protective layer on the wall of the first via by chemical vapor deposition.

12. The method of claim 1, wherein forming the first via in the first solid glass layer of the number of solid glass layers comprises etching the first via in the first solid glass layer of the number of solid glass layers.

13. The method of claim 12, wherein etching the first via in the first solid glass layer of the number of solid glass layers comprises wet etching the first via in the first solid glass layer of the number of solid glass layers.

14. The method of claim 12, wherein etching the first via in the first solid glass layer of the number of solid glass layers comprises dry etching the first via in the first solid glass layer of the number of solid glass layers.

15. The method of claim 1, wherein forming the second via in the second solid glass layer of the number of solid glass layers comprises etching the second via in the second solid glass layer of the number of solid glass layers through the first via in the first solid glass layer of the number of solid glass layers.

16. The method of claim 15, wherein etching the second via in the second solid glass layer of the number of solid glass layers through the first via in the first solid glass layer of the number of solid glass layers comprises wet etching the second via in the second solid glass layer of the number of solid glass layer through the first via in the first solid glass layer of the number of solid glass layers.

17. The method of claim 15, wherein etching the second via in the second solid glass layer of the number of solid glass layers through the first via in the first solid glass layer of the number of solid glass layers comprises wet etching the second via in the second solid glass layer of the number of solid glass layer through the first via in the first solid glass layer of the number of solid glass layers.

* * * * *